(12) United States Patent
Yamazaki

(10) Patent No.: US 7,957,210 B2
(45) Date of Patent: Jun. 7, 2011

(54) VARIABLE DELAY CIRCUIT, MEMORY CONTROL CIRCUIT, DELAY AMOUNT SETTING APPARATUS, DELAY AMOUNT SETTING METHOD AND COMPUTER-READABLE RECORDING MEDIUM IN WHICH DELAY AMOUNT SETTING PROGRAM IS RECORDED

(75) Inventor: Manabu Yamazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 179 days.

(21) Appl. No.: 12/195,914

(22) Filed: Aug. 21, 2008

(65) Prior Publication Data

US 2009/0129179 A1    May 21, 2009

(30) Foreign Application Priority Data

Nov. 20, 2007  (JP) .................................. 2007-300818

(51) Int. Cl.
 *G11C 7/00* (2006.01)
(52) U.S. Cl. .............................. 365/194; 365/76; 365/93
(58) Field of Classification Search .................... 365/76, 365/93, 194
 See application file for complete search history.

(56) References Cited

U.S. PATENT DOCUMENTS

| | | | |
|---|---|---|---|
| 6,449,727 B1 | 9/2002 | Toda | |
| 6,549,047 B2 * | 4/2003 | Yamazaki et al. | 327/158 |
| 6,738,918 B2 | 5/2004 | Toda | |
| 7,102,958 B2 | 9/2006 | Lee et al. | |
| 7,116,146 B2 | 10/2006 | Tokuhiro | |
| 7,277,356 B2 | 10/2007 | Lee et al. | |
| 7,298,192 B2 | 11/2007 | Tokuhiro | |
| 7,369,445 B2 | 5/2008 | Lee et al. | |
| 7,457,174 B2 | 11/2008 | Braun et al. | |
| 7,457,189 B2 | 11/2008 | Lee et al. | |
| 7,636,273 B2 | 12/2009 | Lee et al. | |
| 2002/0181639 A1 | 12/2002 | Song | |
| 2003/0012320 A1 | 1/2003 | Bell | |
| 2003/0041224 A1 | 2/2003 | Toda | |
| 2005/0007835 A1 | 1/2005 | Lee et al. | |

(Continued)

FOREIGN PATENT DOCUMENTS

DE    10 2005 021 894 A1    1/2006

(Continued)

OTHER PUBLICATIONS

Korean Office Action dated Dec. 17, 2009 and issued in corresponding Korean Patent Application 10-2008-0092358.

(Continued)

*Primary Examiner* — Huan Hoang
*Assistant Examiner* — Jason Lappas
(74) *Attorney, Agent, or Firm* — Fujitsu Patent Center

(57) ABSTRACT

A variable delay circuit being able to change a delay amount from when a signal is inputted to when the signal is outputted has a first delay section delaying the signal by a first delay amount, a second delay section delaying the signal by a second delay amount greater than the first delay amount, and a delay amount selector selecting a signal route where the delay amount is a sum of the first delay amount and the second delay amount when the delay amount exceeds a maximum delay amount delayable by the first delay amount section. The delay amount from when a signal is inputted to when the signal is outputted can be set in a wide range, while suppressing the circuit scale.

15 Claims, 14 Drawing Sheets

U.S. PATENT DOCUMENTS

| | | |
|---|---|---|
| 2005/0212574 A1 | 9/2005 | Tokuhiro |
| 2006/0161745 A1 | 7/2006 | Lee et al. |
| 2006/0262611 A1 | 11/2006 | Lee et al. |
| 2006/0290395 A1 | 12/2006 | Tokuhiro |
| 2007/0058478 A1 | 3/2007 | Murayama |
| 2007/0291575 A1 | 12/2007 | Lee et al. |
| 2008/0175071 A1 | 7/2008 | Lee et al. |
| 2009/0059680 A1 | 3/2009 | Lee et al. |

FOREIGN PATENT DOCUMENTS

| | | |
|---|---|---|
| EP | 1 047 220 A2 | 10/2000 |
| JP | 11-316706 | 11/1999 |
| JP | 2004-531981 | 10/2004 |
| JP | 2005-286467 | 10/2005 |
| JP | 2005-322251 | 11/2005 |
| JP | 2007-72699 | 3/2007 |
| WO | WO 03/001732 | 1/2003 |

OTHER PUBLICATIONS

European Search Report issued Feb. 9, 2009 in corresponding European Patent Application 08163124.4.

"Chinese Office Action", mailed by Chinese Patent Office and corresponding to Chinese application No. 200810149251.0 on Jul. 30, 2010, with English translation.

* cited by examiner

VARIABLE DELAY CIRCUIT, MEMORY CONTROL CIRCUIT, DELAY AMOUNT SETTING APPARATUS, DELAY AMOUNT SETTING METHOD AND COMPUTER-READABLE RECORDING MEDIUM IN WHICH DELAY AMOUNT SETTING PROGRAM IS RECORDED

BACKGROUND OF THE INVENTION

1) Field of the Invention

The present invention relates to a technique for controlling a delay amount from when a signal is inputted to when the signal is outputted.

2) Description of the Related Art

In recent memory interface, the speed is increased year after year as seen in DDR3 (Double Data Rate 3) memory interface or the like standardized by JEDEC (Joint Electron Device Engineering Council).

When such memory interface is designed, DLL (Delay Locked Loop) is essential. Inside the DLL, used is a variable delay circuit being able to change the delay amount from when a signal is inputted to when the signal is outputted (refer to Patent Document 1 below, for example).

FIG. 14 is a diagram schematically showing one example of the configuration of a known variable delay circuit, illustrating a technique for changing the delay amount of a signal in a known variable delay circuit 90 formed of a plurality (ten in the example shown in FIG. 14) of delay elements 91-1 to 91-10 connected in series.

Incidentally, as reference character designating the delay element, reference characters 91-1 to 91-10 are used when it is necessary to specify one of the plural delay elements, whereas a reference character 91 is used when an arbitrary delay element is designated.

The known delay circuit 90 increases or decreases the number of the delay elements 91 through which a signal inputted from the forefront delay element 91-1 passes on the basis of a control signal inputted to a control signal input terminal of each of the delay elements 91-1 to 91-10, thereby to be able to change the delay amount from when the signal inputted to when the signal is outputted.

For example, when a High signal (refer to a reference character "H" in FIG. 14) is inputted as a control signal to a control signal input terminal CONT of the delay element 91-8 while Low signals (refer to a reference character "L" in FIG. 14) are inputted as control signals to control signal input terminals CONT of the delay elements 91-1 to 91-7 and 91-9 to 91-10 excepting the delay element 91-8, as shown in FIG. 14, a signal inputted from the forefront delay element 91-1 (refer to a reference character "IN" in FIG. 14) successively passes through a plurality of the delay elements 91-2 to 91-7 along a route from the delay element 91-2 to the delay element 91-7, turns back at the delay element 91-8, successively passes through the delay elements 91-2 to 91-7 in the inverse order along a route from the delay element 91-7 to the delay element 91-2, and is outputted from the forefront delay element 91-1 (refer to a reference character "OUT" in FIG. 14).

As above, in the known variable delay circuit, the delay amount of a signal from when the signal is inputted to when the signal is outputted is changed by increasing/decreasing the number of the delay elements through which the signal passes (propagates).

[Patent Document 1] Japanese Patent Application Laid-Open Publication No. 2005-286467

SUMMARY OF THE INVENTION

In setting the delay amount in the above variable delay circuit 90, a large number of delay elements 91 are required to set a large delay amount or to fractionally set the delay amount, which causes an increase in the circuit scale.

When the number of the above variable delay circuits 90 increases because the number of data signal lines, to which the delay amount is to be set, is increased it is desired to collect a plurality of memory interfaces on one chip, the circuit scale increases, which may cause an increase in the fabrication cost.

Furthermore, necessity of controlling a large number of the delay elements 91 can increase not only the power consumption but also the simultaneous switching noise.

In the light of the above disadvantages, an object of the present invention is to set the delay amount in a wide range with high-accuracy, while suppressing the circuit scale.

To attain the above object, the present invention provides a variable delay circuit comprising a first delay section for delaying the signal by a first delay amount, a second delay section for delaying the signal by a second delay amount greater than the first delay amount, and a delay amount selector for selecting a signal route where the delay amount is a sum of the first delay amount and a second delay amount when the delay amount exceeds a maximum delay amount delayable by the first delay section.

The present invention further provides a memory control circuit having a write leveling function and controlling a plurality of memories, which comprises, for each of the plural memories, a variable delay circuit for output for delaying a data strobe output signal to be outputted to the memory by an output delay amount set with the use of the write leveling function, the variable delay circuit for output comprising a first output delay section for delaying the data strobe output signal by a first output delay amount, a second output delay section for delaying the data strobe output signal by a second output delay amount greater than the first output delay amount, and an output delay amount selector for selecting a signal route where the output delay amount is a sum of the first output delay amount and the second output delay amount when the output delay amount exceeds a maximum output delay amount delayable by the first output delay section.

The present invention still further provides a memory control circuit having a write leveling function and controlling a plurality of memories, which comprises, for each of the plural memories, a variable delay circuit for input for delaying a data input signal inputted from the memory by an input delay amount set according to an output delay amount of a data strobe output signal outputted to the memory set with the use of the write leveling function, the variable delay circuit for input comprising a first input delay section for delaying the data input signal by a first input delay amount, a second input delay section for delaying the data input signal by a second input delay amount greater than the first input delay amount, and an input delay amount selector for selecting a signal route where the input delay amount is a sum of the first input delay amount and the second delay amount when the input delay amount exceeds a maximum input delay amount delayable by the first input delay section.

The present invention still further provides a delay amount setting apparatus for setting the output delay amount of the above-mentioned memory control circuit for each of the plural memories, which comprises an output delay amount setting section for setting an output delay amount to be set for one memory on the basis of an output delay amount having been already set for another memory.

The present invention still further provides a delay amount setting method for setting the output delay amounts of the above-mentioned memory control circuit for the respective plural memories, which comprises the steps of setting an output delay amount to be set for one memory on the basis of an output delay amount having been already set for another memory.

The present invention still further provides a computer-readable recording medium in which delay amount setting program is recorded wherein the program instructs a computer to execute the steps of setting function of setting the output delay amounts of the above-mentioned memory control circuit for the respective plural memories, the delay amount setting program causing the computer to function as an output delay amount setting section for setting an output delay amount to be set for one memory on the basis of an output delay amount having been already set for another memory.

The disclosed technique provides at least one of the following effects or advantages:
(1) The circuit scale can be reduced;
(2) The delay amount in a wide range can be set with high-accuracy;
(3) The power consumption can be reduced; and
(4) The simultaneous switching noise can be reduced.

DESCRIPTION OF THE PREFERRED EMBODIMENTS

[1] Description of First Embodiment

Hereinafter, description will be made of a first embodiment of the present invention with reference to the accompanying drawings.

Figure 1:
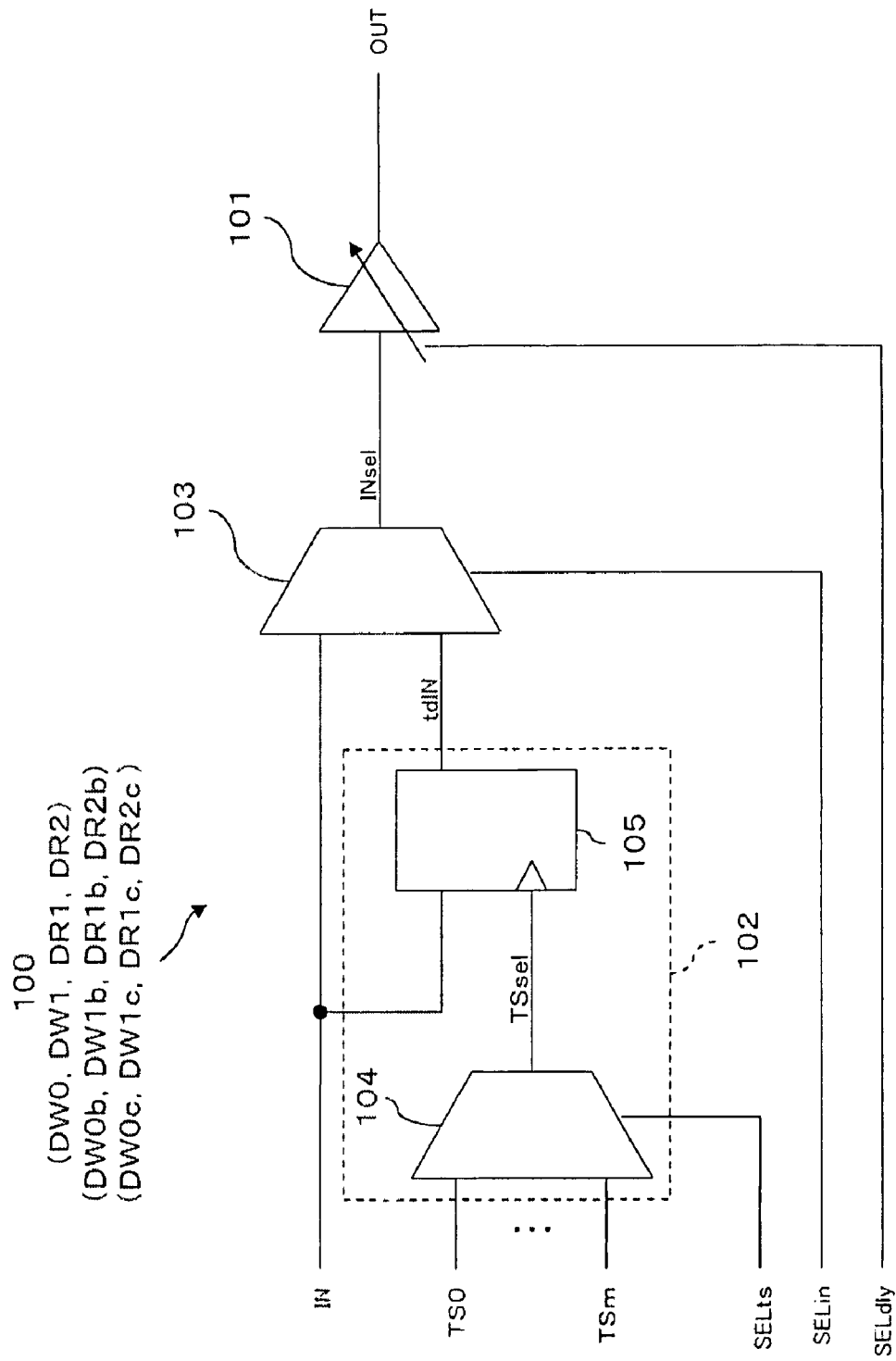
FIG. 1 is a diagram schematically showing one example of the configuration of a variable delay circuit according to a first embodiment of this invention.
Figure 2:
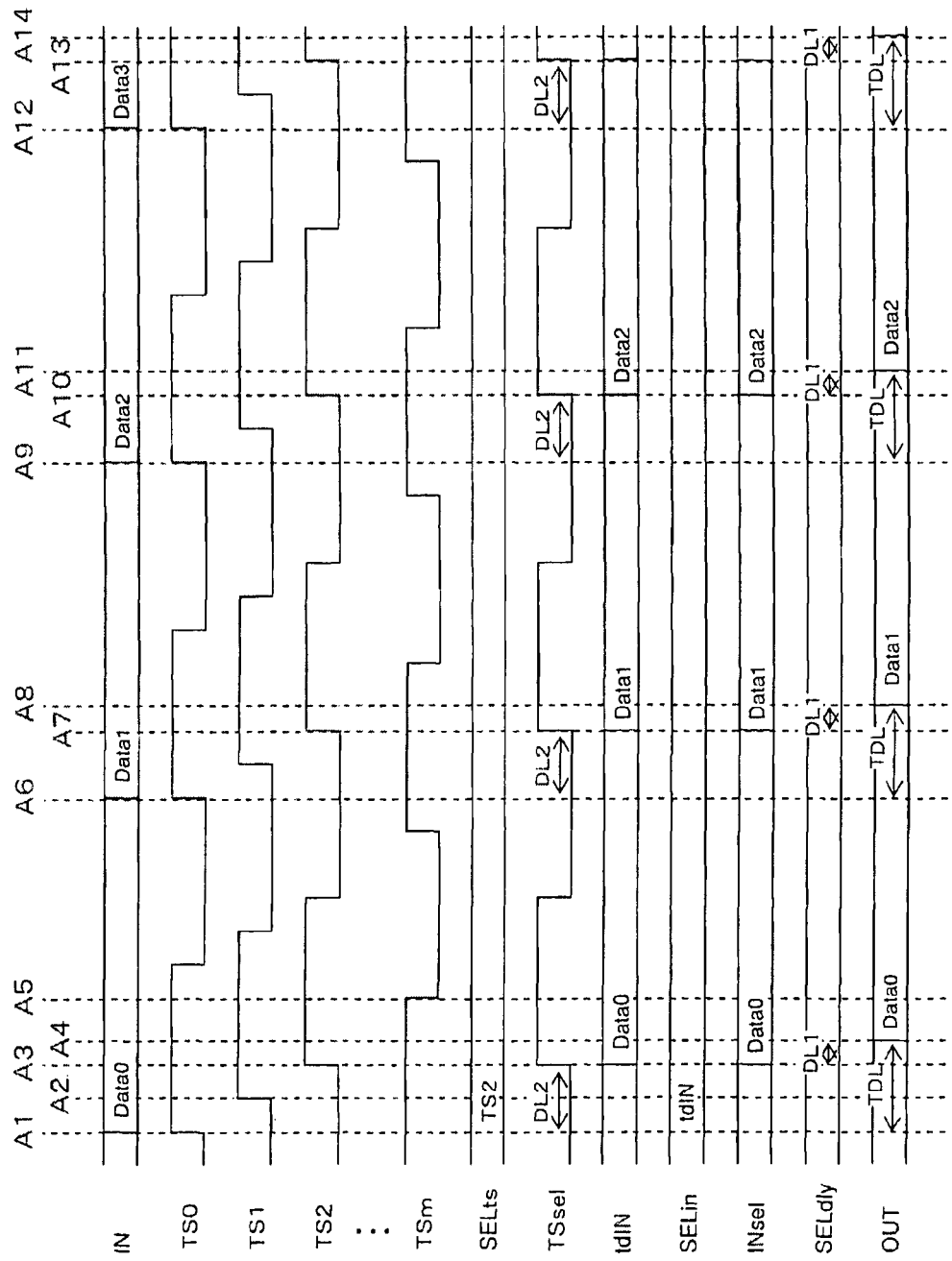
FIG. 2 is a timing chart for illustrating an operation of the variable delay circuit according to the first embodiment of this invention.

FIG. 1 is a diagram schematically showing one example of the configuration of a variable delay circuit according to a first embodiment of the present invention. FIG. 2 is a timing chart for illustrating an operation of the variable delay circuit in FIG. 1.

A variable delay circuit 100 according to the first embodiment of the present invention can change a delay amount TDL from when a signal is inputted to when the signal is outputted. As shown in FIG. 1, the variable delay circuit 100 is configured as a circuit having a first delay circuit (first delay section) 101, a second delay circuit (second delay section) 102 and a selector (delay amount selector) 103.

The first delay circuit 101 delays an inputted signal by a first delay amount (first delay time) DL1. The first delay circuit 101 is formed of, for example, a digital delay circuit which causes a signal INsel inputted from the selector 103 to be described later to pass through a predetermined number of delay elements (not shown) connected in series to delay the signal by the first delay amount DL1 on the basis of a delay control signal SELdly inputted based on a delay amount TDL to be set, and outputs the signal as a data output signal OUT. Incidentally, since the digital delay circuit is known, detailed description of the digital delay circuit is omitted here.

As the first delay amount DL1, set is the number of delay elements through which the signal INsel passes, with a maximum delay amount MDL corresponding to a sum of delay elements configuring the first delay circuit 101 being the upper limit.

In the first delay circuit 101, the number of delay elements to pass the signal INsel is changed step-wisely to be able to set the first delay amount DL1. When the first delay circuit 101 is formed of eight delay elements, for example, eight kinds of the first delay amount DL1 can be set.

The second delay circuit 102 delays an inputted signal by a second delay amount (second delay time) DL2 greater than the first delay amount DL1. The second delay circuit 102 has, for example, a selector (selecting circuit) 104 and a D flip-flop (sequential circuit) 105.

The selector 104 is inputted thereto plural ((m+1), where m is a natural number equal to or larger than 1) kinds of timing signals TS0 to TSm having different phases, and selects any one of these kinds of inputted timing signals TS0 to TSm.

These plural kinds of timing signals TS0 to TSm have the same waveform (wavelength and amplitude). The timing 0-th signal TS0 to the m-th timing signal TSm are successively inputted to the selector 104 at intervals larger than the maximum delay amount MDL of the first delay circuit 101, each delayed from the preceding.

According to this embodiment, the plural kinds of timing signals TS0 to TSm ranging from the 0-th timing signal TS0 to the m-th timing signal TSm are each delayed by a phase α from the preceding one excepting the forefront one, for example, and successively inputted to the selector 104. Between the phase α and the number m+1 of the timing signals, an equation m+1=360/α is established. This embodiment will be explained by way of an example where α=90 degrees. Wherein, m+1=360/90, hence m=3.

In consequence, the selector 104 selects one timing signal from the plural timing signals TS0 to TSm having different phases on the basis of, for example, a first selection signal SELts inputted on the basis of a delay amount to be set, and outputs the selected one as a selected timing signal TSsel (CLK node).

The D flip-flop 105 delays an inputted signal by a second delay amount DL2 according to a selected timing signal TSsel selected by the selector 104. The D flip-flop 105 outputs a data input signal IN as a signal tdIN in synchronization with a leading (or trailing) edge of the selected timing signal TSsel inputted from the selector 104, for example. The D flip-flop 105 holds a value of the signal tdIN until the next leading (or trailing) edge of the selected timing signal TSsel inputted from the selector 104.

The selector 103 selects a route of the signal on the basis of a second selection signal SELin inputted based on a delay amount TDL to be set and the maximum delay amount MDL delayable by the first delay circuit 101.

In this embodiment, when the delay amount TDL does not exceed the maximum delay amount MDL, for example, the selector 103 selects a route to output the data input signal IN as a signal INsel to the first delay circuit 101. On the other hand, when the delay amount TDL exceeds the maximum delay amount MDL, the selector 103 selects a route to output the signal tdIN inputted from the D flip-flop 105 as a signal INsel to the first delay circuit 101.

In other words, the selector 103 selects a route for the signal where the delay amount TDL becomes equal to a first delay amount DL1 when the delay amount TDL does not exceed the maximum delay amount MDL, whereas the selector 103 selects a route for the signal where the delay amount TDL becomes a sum of the first delay amount DL1 and a second delay amount DL2 when the delay amount TDL exceeds the maximum delay amount MDL, in this embodiment.

Meanwhile, there is anxiety that glitch occurs in an output signal from the above-mentioned selectors 103 and 104. However, an effect of glitch can be avoided by providing a training period to disable data transmitted and received during the training period, or by designing the selectors 103 and 104 in consideration of switching timings of the first selection signal SELts and the second selection signal SELin so that the glitch does not occur.

Next, description will be made of an operation of the variable delay circuit 100 according to the first embodiment of this invention configured as above at the time that the second timing signal TS2 is selected as the selected timing signal TSsel, with reference to FIG. 2. In the following example, α=90 degrees.

To the selector 104, the 0-th timing signal TS0 is inputted at the same timing or almost the same timing as the data input signal IN which is Data0 (refer to a time "A1" in FIG. 2), and the first timing signal TS1 is inputted in a state (at a timing) where its phase is delayed by α from the 0-th timing signal TS0 (refer to a time "A2" in FIG. 2). Similarly, the second timing signal TS2 to the m-th timing signals TSm are successively inputted to the selector 104 in a state where each of the phases of the second timing signal TS2 to the m-th timing signals TSm is delayed by α from the phase of the preceding one (refer to times "A3" and "A5" in FIG. 2).

In this situation, the selector 104 selects the second timing signal TS2 on the basis of the first selection signal SELts (refer to "SELts" in FIG. 2), hence the selected timing signal TSsel is inputted to the D flip-flop 105 at a timing in synchronization with rise of the second timing signal TS2 (refer to times "A3", "A7", "A10" and "A13" in FIG. 2).

When the D flip-flop 105 is inputted thereto the selected timing signal TSsel at a timing in synchronization with rise of the second timing signal TS2, with Data 0 being held as the data input signal IN, the D flip-flop 105 outputs a signal tdIN (refer to "A3" in FIG. 2). In other words, when Data0 is inputted as the data input signal IN, the D flip-flop 105 outputs the signal as the signal tdIN, delaying the signal by the second delay amount DL2 (refer to times "A1" to "A3" in FIG. 2).

The selector 103 outputs the signal tdIN, as a signal INsel, inputted from the D flip-flop 105 at a timing of rise of the second selection signal SELin to the first delay circuit 101 on the basis of the second selection signal SELin (refer to a time "A3" in FIG. 2). The first delay circuit 101 delays the signal Insel by the first delay amount DL1 on the basis of a delay control signal SELdly, and outputs the signal INsel as a data output signal OUT (refer to a time "A4" in FIG. 2).

Similarly, when inputted thereto each of data input signals IN as Data1 to Data3 (refer to times "A6", "A9" and "A12" in FIG. 2), the D flip-flop 105 delays each of the Data1 to Data3 by the second delay amount DL2, and outputs each of signals tdIN (refer to times "A7", "A10" and "A13" in FIG. 2). The first delay circuit 101 delays each of signals corresponding to Data1 to Data3 by the first delay amount DL1, and outputs the signal as a data output signal OUT (refer to times "A8", "A11" and "A14" in FIG. 2).

Whereby, each of Data0 to Data3 is delayed by a delay amount TDL which is a sum of the first delay amount DL1 and the second delay amount DL2, and outputted as a data output signal OUT.

In the variable delay circuit 100 according to the first embodiment of this invention, a plurality of the timing signals TS0 to TSm having different phases are delayed at larger intervals than the maximum delay amount MDL of the first delay circuit 101 and inputted to the selector 104, whereby the second delay amount DL2 can be set at large intervals, thereafter the first delay amount DL1 can be set at small intervals. In consequence, the delay amount TDL in a wide range can be set with high-accuracy to improve the serviceability. As compared with a case where the delay amount TDL is set only by the first delay circuit 101, the number of the delay elements of the first delay circuit 101 can be decreased. Therefore, it is possible to set the delay amount TDL in a wide range with high-accuracy, while suppressing the circuit scale.

It becomes unnecessary to provide a large number of delay elements, by selecting one of a plurality of the timing signals TS0 to TSm by the selector 104 and delaying the signal IN by the second delay amount DL2 in synchronization with rise of the timing signal selected by the selector 104, which can decrease the power consumption and the simultaneous switching noise.

[2] Second Embodiment of the Invention

Figure 3:
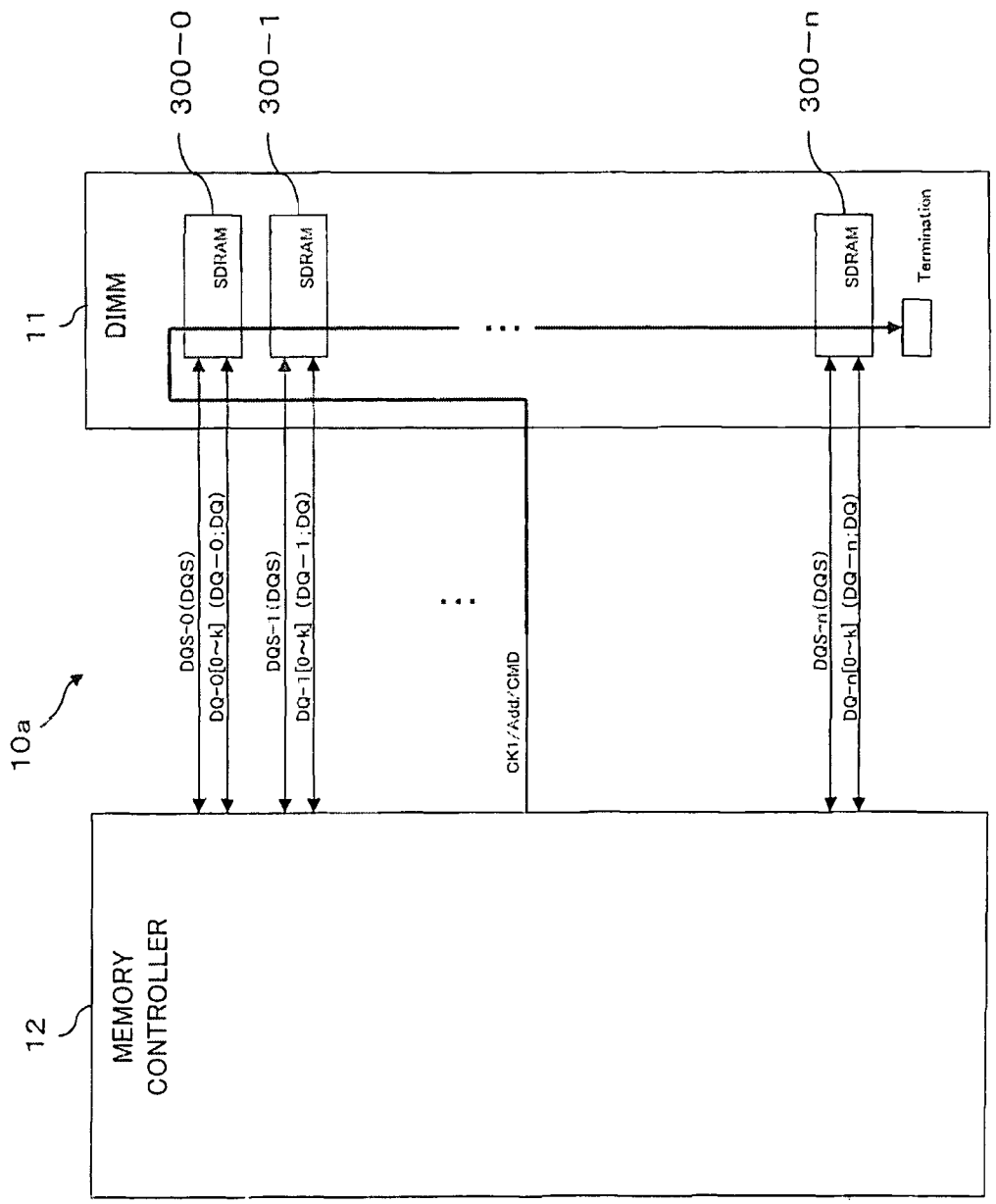
FIG. 3 is a diagram schematically showing one example of the configuration of an information processing apparatus according to a second embodiment of this invention.
Figure 4:
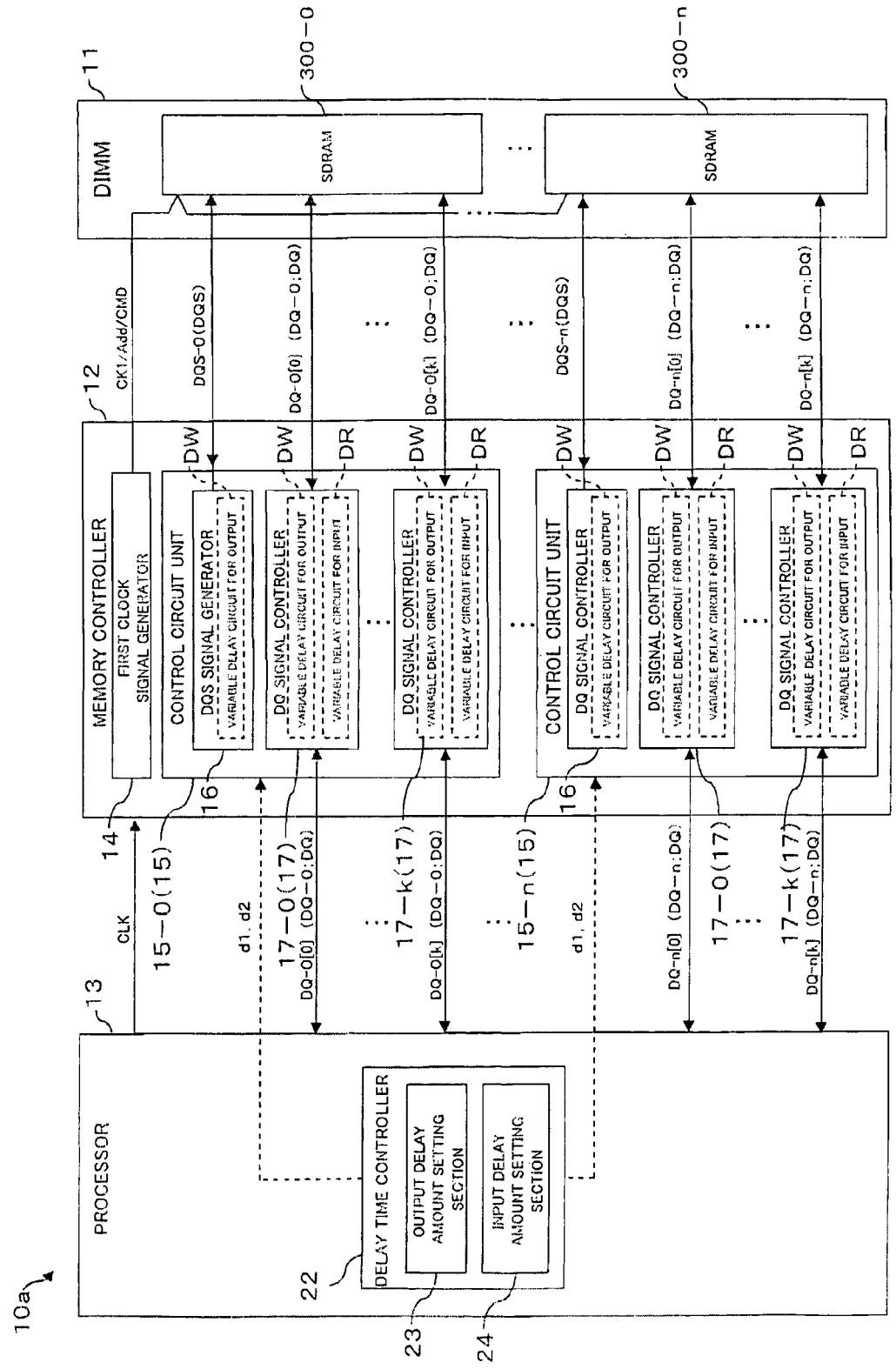
FIG. 4 is a diagram schematically showing the example of the configuration of the information processing apparatus according to the second embodiment of this invention.
Figure 5:
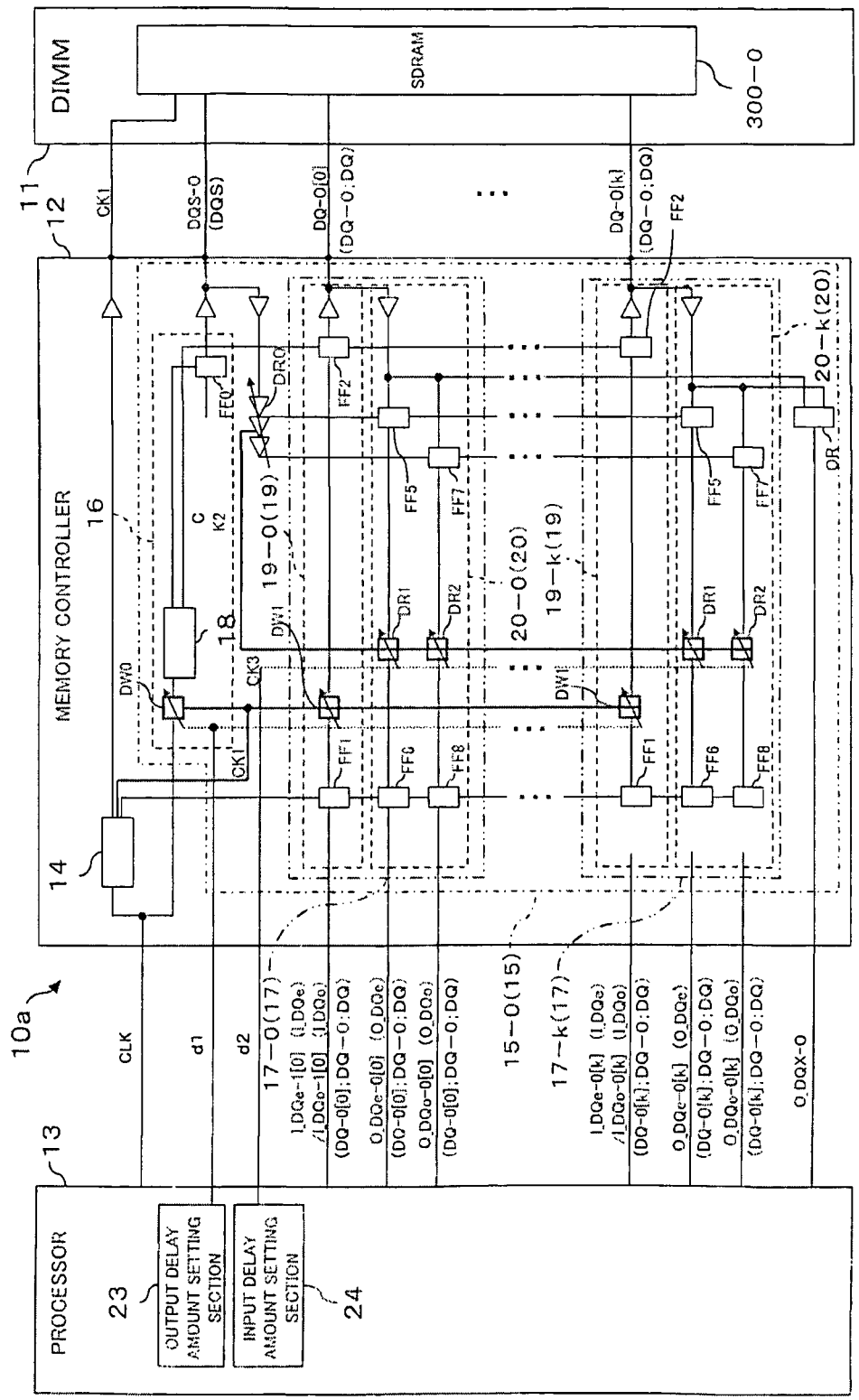
FIG. 5 is a diagram schematically showing one example of the configuration of a memory controller of the information processing apparatus according to the second embodiment of this invention.
Figure 6:
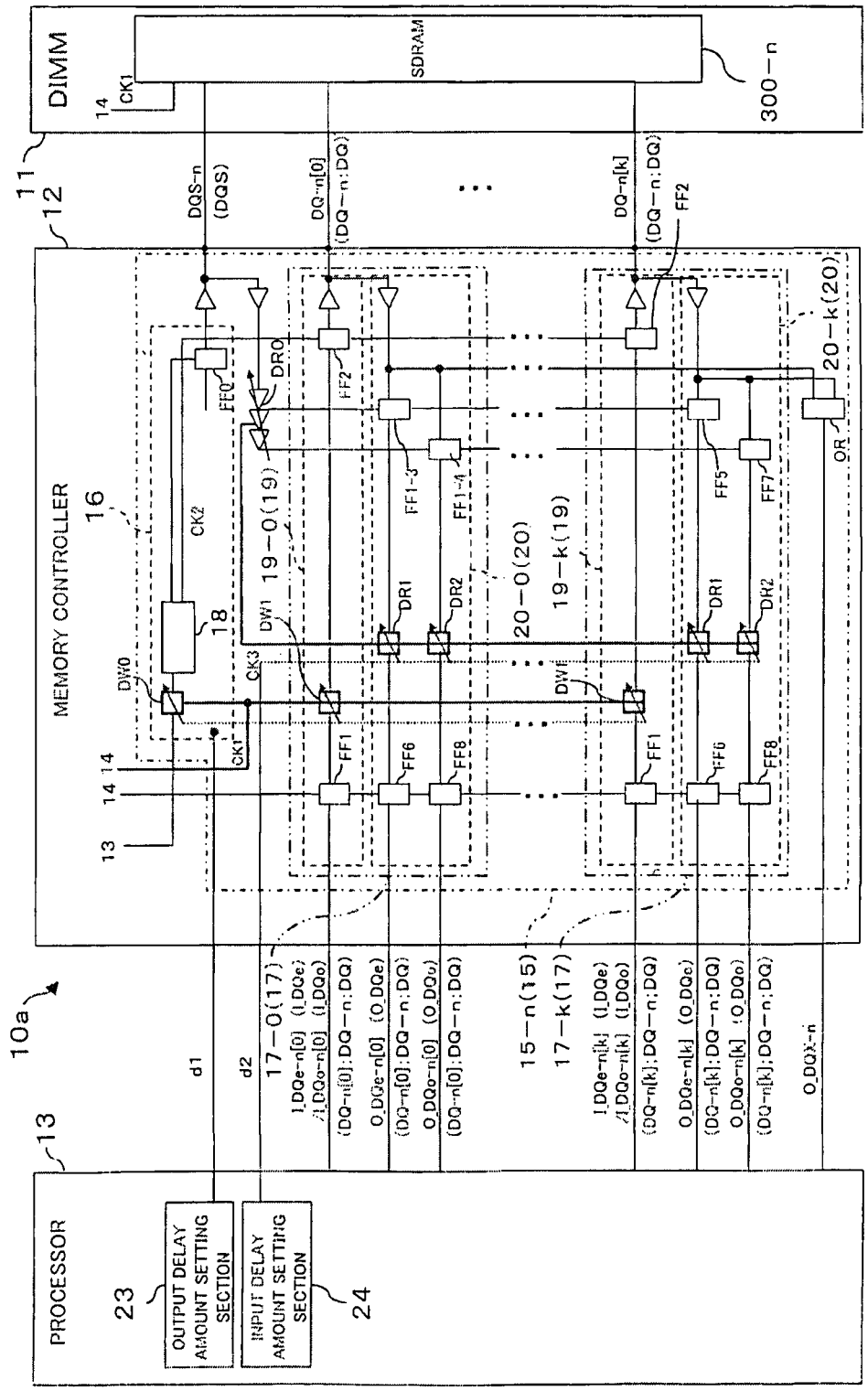
FIG. 6 is a diagram schematically showing another example of the configuration of the memory controller of the information processing apparatus according to the second embodiment of this invention.

FIGS. 3 and 4 are diagrams schematically showing one example of the configuration of an information processing apparatus according to a second embodiment of this invention. FIG. 3 is a diagram showing a relationship between a memory controller and a DIMM. FIG. 4 is a diagram showing a relationship among a processor, the memory controller and the DIMM. FIGS. 5 and 6 are diagrams schematically showing examples of the circuit configuration of the memory controller.

An information processing apparatus (delay amount setting apparatus) 10a according to the second embodiment of this invention is configured as a computer having a DIMM (Dual Inline Memory Module) 11, a memory controller (memory control circuit) 12 and a processor 13 (refer to FIG. 4).

The DIMM 11 is a memory module mounted thereon a plurality of memories. In this embodiment, the DIMM 11 has a plurality (n+1, where n is a natural number equal to or larger than 1) of SDRAMs (Synchronous DRAM: memory) 300-0 to 300-n, as shown in FIGS. 3 and 4. "n+1" represents the number of the channels (ch). In the drawings, only part of the SDRAMs (for example, SDRAM 300-0 and SDRAM 300-n) are shown. Incidentally, SDRAM is a known technique, detailed description of which is thus omitted here.

As reference numeral designating the SDRAM, a reference numeral 300-0, 300-1, . . . or 300-n is used when it is necessary to specify one of a plurality of the SDRAMs, whereas a reference numeral 300 is used when an arbitrary SDRAM is designated.

In this embodiment, flyby topology is employed in a part of the wiring between the memory controller 12 and the plural SDRAMs 300-0 to 300-n.

Flyby topology means wiring of the memory controller 12 to the plural SDRAMs 300-0 to 300-n in a daisy chain, as shown in FIG. 3.

In this embodiment, a clock signal line for outputting (supplying) a clock signal CK1 generated by a first clock generator 14 to be described later is wired to the SDRAMs 300-0 to 300-n in a daisy chain As shown in FIGS. 3 and 4, the clock signal line connected to the first clock signal generator 14 (refer to FIG. 4) connects the SDRAM 300-0 to 300-n in a row. A signal line for outputting an address signal Add and a command signal CMD is wired in a daisy chain to the SDRAMs 300-0 to 300-n, like the clock signal line.

Data signal lines connecting the memory controller 12 to the plural SDRAMs 300-0 to 300-n are connected from the memory controller 12 to the plural SDRAMs 300-0 to 300-n in parallel. In an example shown in FIG. 4, one signal line (data signal line) for transmitting a data strobe signal DQS and k+1 DQ signal lines (data signal lines) for transmitting data signals DQ are connected from the memory controller 12 to each of the SDRAMs 300 in parallel. As seen from the plural SDRAMs 300-0 to 300-n, these signal lines are of equal line length (equal length). In other words, the plural data signal lines connecting the memory controller 12 to each of the plural SDRAMs 300-0 to 300-n are so connected as to have an equal length.

Meanwhile, FIGS. 4 through 6 show that the clock signal line and the signal line for outputting an address signal Add and a command signal CMD (refer to reference characters "Add" and "CMD" in FIG. 4, for example) are connected to a position in the vicinity of an end (upper part of the paper) of the DIMM 11, for the sake of convenience. Actually, these signal lines are connected to a position in the middle (the middle of the paper) of the DIMM 11, as shown in FIG. 3.

The memory controller 12 is a DDR 3 (Double Data Rate 3) memory interface which supplies a clock signal CK1 through the clock signal line to the plural SDRAM 300-0 to 300-n connected by the clock signal line in a daisy chain to control the read/write operation. The memory controller 12 has, for example, a first clock signal generator 14 and a plurality of control circuit units 15-0 to 15-n, as shown in FIG. 4.

The memory controller 12 has the write leveling function. The write leveling function will be described later.

The plural control circuit units 15-0 to 15-n are provided for the plural SDRAMs 300-0 to 300-n descried above, respectively. In other words, the memory controller 12 has the control circuit unit 15-0 corresponding to the SDRAM 300-0, the control circuit unit 15-n corresponding to the SDRAM 300-n and so forth, as shown in FIG. 4, for example.

Hereinafter, as reference numeral designating the control circuit unit, a reference character 0, 1, . . . or n is used with "-" (hyphen) behind the reference numeral 15 when it is necessary to specify one of the plural control circuit units, whereas a reference character 15 is used when an arbitrary control circuit unit is designated.

In the drawings, only the control circuit 15-0 and the control circuit unit 15-n are shown, for the sake of convenience.

The first clock signal generator 14 generates and outputs the clock signal CK1 at a predetermined cycle on the basis of the clock signal CLK inputted from the processor 13 to be described later. As shown in FIGS. 5 and 6, for example, the first clock signal generator 14 outputs the clock signal CK1 to the DIMM 11 (SDRAMs 300-0 to 300-n) and to each of the control circuit units 15-0 to 15-n through the clock signal lines (refer to a reference character "CK1" in FIGS. 5 and 6). The first clock signal generator 14 may output a signal in the same cycle as the clock signal CLK as the clock signal CK1, or may output a clock signal in another clock cycle such as ½, ¼ or the like of the clock cycle of the clock signal CLK.

The control circuit unit 15 controls input/output of the data strobe signal DQS and the data signal DQ. As shown in FIGS. 4 through 6, for example, the control circuit unit 15 has a DQS signal generator 16, a read-side DQS delay circuit DR0 (refer to FIGS. 5 and 6), a plurality (k+1, where k is a natural number equal to or larger than 1) of DQ signal controllers 17-0 to 17-k and an OR circuit OR (refer to FIGS. 5 and 6).

Hereinafter, as reference numeral designating the DQ signal controller, a reference numeral 0, 1, . . . or k is used with "-" (hyphen) behind the reference numeral 17 when it is necessary to specify one of the DQ signal controllers, whereas a reference numeral 17 is used when an arbitrary DQ signal controller is designated.

The drawings show only the DQ signal controller 17-0 and the DQ signal controller 17-k, for the sake of convenience.

The DQS signal generator 16 generates a data strobe signal (data strobe output signal) DQS to be outputted to the SDRAM 300, one DQS signal generator 16 being provided in the control circuit unit 15. In the control circuit unit 15-0, for example, the DQS signal generator 16 generates a data strobe signal DQS-0 and outputs the data strobe signal to the SDRAM 300-0, as shown in FIG. 5. In the control circuit unit 15-n, the DQS signal generator 16 generates a data strobe signal DQS-n and outputs the data strobe signal to the SDRAM 300-n, as shown in FIG. 6.

Hereinafter, as reference character designating the data strobe signal, a reference character DQS-0, DQS-1, . . . or DQS-n is used when it is necessary to specify one of a plurality of data strobe signals, whereas a reference character DOS is used when an arbitrary data strobe signal is designated.

The DQS signal generator 16 has a variable delay circuit for output DW0, a second clock signal generator 18 and a flip-flop FF0, as shown in FIGS. 5 and 6, for example.

The variable delay circuit for output DW0 is formed of the variable delay circuit 100 according to the first embodiment described above. The variable delay circuit for output DW0 delays a clock signal CLK (corresponding to a reference character "IN" in FIG. 1) inputted from the processor 13 to be described later by an output delay amount set by an output delay amount setting section 23 to be described later on the basis of an output control signal d1 from the output delay amount setting section 23 to be described later, and outputs the clock signal CLK to the second clock signal generator 18 (corresponding to a reference character "OUT" in FIG. 1). Whereby, the variable delay circuits for output DW0 delays the data strobe signal DQS to be outputted to the SDRAM 300 by the output delay amount.

In this embodiment, a output delay amount is set for each of the plural control circuit units 15-0 to 15-n. In concrete, an output delay amount Dt1-0 is set to the variable delay circuit for output DW0 in the control circuit unit 15-0. Similarly, an output delay amount Dt1-n is set to the variable delay circuit for output DW0 in the control circuit unit 15-n.

Hereinafter, as reference character designating the output delay amount, a reference character Dt1-0, Dt1-1, ... or Dt1-n is used when it is necessary to specify one of a plurality of output delay amounts, whereas a reference character Dt1 is used when an arbitrary output delay amount is designated.

In the variable delay circuit for output DW0 in this embodiment, the output control signal d1 corresponding to the delay control signal SELdly, the first selection signal SELts and the second selection signal SELin in the first embodiment described above, and the output delay amount Dt1 corresponds to the delay amount TDL in the first embodiment described above.

In the variable delay circuit for output DW0 according to this embodiment, used is a first delay circuit (first delay section) 101 which can set the first delay amount DL1 (refer to the above first embodiment) in eight stages from "0" to "7", where the maximum delay amount MDL is "7".

To the variable delay circuit for output DW0 according to this embodiment, inputted are a plurality of clock signals CK1-0 to CK1-m taken out (extracted) from the first clock signal generator 14. These plural clock signals CK1-0 to CK1-m correspond to the plural timing signals TS0 to TSm, respectively, in the first embodiment described above.

In this embodiment, these plural clock signals CK1-0 to CK1-m are taken out from predetermined positions in the first clock signal generator 14, for example, so that the clock signals CK1-0 to CK1-m ranging from the 0-th clock signal CK1-0 to the m-th clock signal CK1-m are delayed at intervals of α in phase (=90 degrees), and successively inputted to the variable delay circuit for output DW0.

Incidentally, as a method of taking out the plural clock signals CK1-0 to CK1-m from the first clock signal generator 14, any one of various known methods may be adapted. When the first clock signal generator 14 is a variable delay circuit formed of a plurality of delay elements (not shown) connected in series, for example, the plural clock signals CK1-0 to CK1-m are taken out from the contacts of the respective delay elements so that the 0-th clock signal CK1-0 to the m-th clock signal CK1-m are delayed at intervals α (=90 degrees) in phase, and successively inputted to the variable delay circuit for output DW0. As this, the delay elements forming the first clock signal generator 14 are so designed as to be in number (in stages) having a margin, and the variable delay circuit (that is, a variable delay circuit used in the DLL (Delay Locked Loop)) forming the first clock signal generator 14 is formed of a circuit equivalent to the variable delay circuit for output DW0. Whereby, it is possible to easily determine conditions that can provide the maximum delay amount DML (=α) in the variable delay circuit for output DW0 even when the output delay amount Dt1 of the variable delay circuit for output DW0 is fluctuated due to an effect of variations caused by the manufacturing process, fluctuations in the power source voltage, etc.

In the drawings, the plural clock signals CK1-0 −0 to CK1-m are designated by a reference character CK1, for the sake of convenience.

Accordingly, the variable delay circuit for output DW0 has the first delay circuit 101 which delays the data strobe signal DQS by the first delay amount (first output delay amount) DL1, a second delay circuit (second output delay section) 102 which delays the data strobe signal DQS by a second delay amount (second output delay amount) DL2 greater than the first delay amount DL1, and a selector (output delay amount selector) which selects a signal route where the output delay amount Dt1 is a sum of the first delay amount DL1 and the second delay amount DL2 when the output delay amount Dt1 exceeds the maximum delay mount (maximum output delay amount) MDL delayable by the first delay circuit 101 (refer to FIG. 1).

In the second delay circuit 102, the selector (selecting circuit for output) 104 selects any one of the plural kinds of clock signals CK1-0 to CK1-m having different phases on the basis of the output delay amount Dt1, and a D flip-flop (sequential circuit for output) 105 delays the data strobe signal DQS by the second delay amount DL2 according to the timing signal selected by the selector 104 (refer to FIG. 1).

The second clock signal generator 18 generates and outputs (supplies) a clock signal CK2 on the basis of the clock signal CLK inputted from the processor 13 to be described later. As shown in FIGS. 5 and 6, for example, when the clock signal CLK is inputted, the second clock signal generator 18 outputs a second clock signal CK2 in a predetermined cycle to both the flip-flop FF0 and a flip-flop FF2 to be described later. The second clock signal generator 18 may output a clock signal CK2 in the same clock cycle as the clock signal CLK, or may output a clock signal in a clock cycle that is ½, ¼ or the like of the clock cycle of the clock signal CLK.

The flip-flop FF0 generates the data strobe signal DQS on the basis of the clock signal CK2 inputted from the second clock signal generator 18, and outputs the data strobe signal DQS. As shown in FIGS. 5 and 6, for example, when the clock signal CK2 is inputted, the flip-flop FF0 generates the data strobe signal DQS, and outputs the data strobe signal DQS to the SDRAM 300.

The read-side DQS delay circuit DR0 delays the data strobe signal DQS inputted from the SDRAM 300. The read-side delay circuit DR0 is formed of, for example, a digital delay circuit which causes the data strobe signal DQS inputted from the SDRAM 300 to pass through a predetermined number of delay elements connected in series to delay the data strobe signal DQS. The read-side delay circuit DR0 outputs the delayed data strobe signal DQS to both a flip-flop FF5 and a flip-flop FF7 to be described later.

The DQ signal controller 17 controls input/output of the data signal DQ. As shown in FIGS. 5 and 6, for example, the DQ signal controller 17 has a DQ signal output controller 19 and a DQ signal input controller 20. In concrete, as shown in FIGS. 5 and 6, in each of a plurality (n+1) of the control circuit units 15-0 to 15-n, a DQ signal controller 17-0 is provided with a DQ signal output controller 19-0 and a DQ signal input controller 20-0. Similarly, a DQ signal controller 17-k is provided with a DQ signal output controller 19-k and a DQ signal input controller 20-k.

Hereinafter, as reference numeral designating the DQ signal output controller, a reference numeral 19-0, 19-1, ... or 19-k is used when it is necessary to specify one of a plurality (k+1) of the DQ signal output controllers, whereas a reference numeral 19 is used when an arbitrary DQ signal controller is designated. Similarly, as reference numeral designating the DQ signal input controller, a reference numeral 20-0, 20-1, . . . or 20-k is used when it is necessary to specify one of the plural DQ signal input controllers, whereas a reference numeral 20 is used when an arbitrary DQ signal input controller is designated.

The DQ signal output controller 19 performs a control to output a data signal DQ inputted from the processor 13 to be described later to the SDRAM 300 at the time of the write operation. As shown in FIG. 5, in the control circuit unit 15-0, for example, the DQ signal output control unit 19 performs, correspondingly to each of a plurality (k+1) of the DQ signal output controllers 19-0 to 19-k, a control to output a first data signal I_DQe-0[0] or a second data signal I_DQo-0[0] inputted from the processor 13 to be described later as a data signal DQ-0[0] to the SDRAM 300-0. Similarly, the DQ signal controller 19 performs, correspondingly to each of a plurality (k+1) of the DQ signal output controllers 19-0 to 19-k, a control to output a first data signal I_DQe-0[k] or a second data signal I_DQo-0[k] inputted from the processor 13 to be described later as a data signal DQ_0[k] to the SDRAM 300-0.

As shown in FIG. 6, in the control circuit unit 15-n, for example, the DQ signal output controller 19 performs, correspondingly to each of a plurality of the DQ signal output controllers 19-0 to 19-k, a control to output a first data signal I_DQe-n[0] or a second data signal I_DQo-n[0] inputted from the processor 13 to be described later as a data signal DQ-n[0] to the SDRAM 300-n. Similarly, the DQ signal output controller 19 performs, correspondingly to each of a plurality of the DQ signal output controllers 19-0 to 19-k, a control to output a first data signal I_DQe-n[k] or a second data signal I_DQo-n[k] inputted from the processor 13 to be described later as a data signal DQ-n[k] to the SDRAM 300-n.

Hereinafter, as reference character designating the first data signal, a reference character I_DQe-0[0], I_DQe-0[1], . . . or I_DQe-0[k], or a reference character I_DQe-n[0], I_DQe-n[1], . . . or I_DQe-n[k] is used when it is necessary to specify one of the plural first data signals, whereas a reference character I_DQe is used when an arbitrary first data signal is designated. Hereinafter, as reference character designating the second data signal, a reference character I_DQo-0[0], I_DQo-0[1], . . . or I_DQo-0[k], or I_DQo-n[0], I_DQo-n[1], . . . or I_DQo-n[k] is used when it is necessary to specify one of the plural second data signals, whereas a reference character I_DQo is used when an arbitrary second data signal is designated.

Hereinafter, with respect to the data signal, when it is necessary to specify the first data signal and the second data signal, a reference character I_DQe, or I_DQe-0[0], I_DQe-0[1], . . . or I_DQe-0[k], or I_DQe-n[0], I_DQe-n[1], . . . or I_DQe-n[k] designating the first data signal, and I_DQo, or I_DQo-0[0], I_DQo-0[1], . . . or I_DQo-0[k], or I_DQo-n[0], I_DQo-n[1], . . . or I_DQo-n[k] designating the second data signal are used. Further, when an arbitrary data signal is designated, a reference character DQ is used. Still further, when it is unnecessary to specify the first data signal and the second data signal, reference characters DQ-0[0] to DQ-0[k] and DQ-n[0] to DQ-n[k] corresponding to the respective SDRAMs 300-0 to 300-n are used. Further, when it is unnecessary to specify the first data signal and the second data signal, reference characters DQ-0 to DQ-n may be used instead of reference characters DQ-0[0] to DQ-0[k] and DQ-n[0] to DQ-n[k] designating the data signals corresponding to the respective SDRAMs 300-0 to 300-n, for the sake of convenience.

In other words, the first data signals I_DQe-0[0] to I_DQe-0[k] corresponding to the SDRAM 300-0 correspond to the first data signal I_DQe, the data signals DQ-0[0] to DQ-0[k], the data signal DQ-0 and the data signal DQ. The first data signals I_DQe-n[0] to I_DQe-n[k] corresponding to the SDRAM 300-n correspond to the first data signal I_DQe, the data signals DQ-n[0] to DQ-n[k], the data signal DQ-n and the data signal DQ. The second data signals I_DQe-0[0] to I_DQe-0[k] corresponding to the SDRAM 300-0 correspond to the second data signal I_DQo, the data signals DQ-0[0] to DQ-0[k], the data DQ-0 and the data signal DQ. The second data signals I_DQo-n[0] to I_DQo-n[k] corresponding to the SDRAM 300-n correspond to the second data signal I_DQo, the data signals DQn[0] to DQ-n[k], the data DQ-n and the data signal DQ.

The DQ signal input controller 19 performs a control to multiplex the first data signal I_DQe and the second data signal I_DQo together, and outputs the multiplexed signal to the SDRAM 300.

Incidentally, a method of multiplexing the first data signal I_DQe and the second data signal I_DQo together and outputting the multiplexed signal to the SDRAM is known, detailed description of which is thus omitted here.

The DQ signal output controller 19 has, as shown in FIGS. 5 and 6, a flip-flop FF1, a variable delay circuit for output DW1 and a flip-flop FF2.

When the clock signal CK1 inputted from the first clock signal generator 14 is inputted, the flip-flop FF1 outputs the first data signal I_DQe or the second data signal I_DQo inputted from the processor 13 to be described later to the variable delay circuit for output DW1.

The variable delay circuit for output DW1 is formed of the variable delay circuit 100 according to the first embodiment described hereinabove. The variable delay circuit for output DW1 delays the first data signal I_DQe or the second data signal I_DQo (corresponding to "IN" in FIG. 1) inputted from the flip-flop FF1 by an output delay amount Dt1 set by the output delay amount setting section 23 to be described later on the basis of the output control signal d1 from the output delay amount setting section 23, and outputs the data signal to the flip-flop FF2 (corresponding to "OUT" in FIG. 1).

The variable delay circuit for output DW1 is configured similarly to the variable delay circuit for output DW0 mentioned above, detailed description of which is thus hence mitted here.

When a clock signal CK2 from the second clock signal generator 18 is inputted, the flip-flop FF2 outputs the first data signal I_DQe or the second data signal I_DQo inputted from the variable delay circuit for output DW1 to the SDRAM 300.

In this embodiment, the same output delay amount Dt1 is set for each of the plural SDRAMs 300-0 to 300-n.

In concrete, an output delay amount Dt1-0 is set to each of the variable delay circuits for output DW0 and DW1 provided in the control circuit unit 15-0 shown in FIG. 5. Similarly, an output delay amount Dt1-n is set to each of the variable delay circuits for output DW0 and DW1 provided in the control circuit unit 15-n shown in FIG. 6.

Hereinafter, with respect to reference character designating the variable delay circuit for output, a reference characters DW0, DW1 or the like are used when it is necessary to specify one of the plural variable delay circuits for output, whereas a reference character DW is used when an arbitrary variable delay circuit for output is designated.

In the following description, a reference character DW-0 may be used to designate a variable delay circuit for output corresponding to the SDRAM 300-0 of the 0-ch, for the sake of convenience. Similarly, a reference character DW-n may be used to designate a variable delay circuit for output corresponding to the SDRAM 300-0 of the n-ch.

The DQ signal input controller 20 controls to output a data signal (data input signal) DQ inputted from the SDRA 300 to the processor 13 to be described later at the time of reading operation. In the control circuit unit 15-0, for example, the plural DQ signal input controller 20 performs, correspondingly to each of the plural DQ signal input controllers 20-0 to 20-k, a control to output a data signal DQ-0[0] inputted from the SDRAM 300-0 correspondingly to each of the plural DQ signal input controller 20-0 to 20-k as a third data signal O_DQe-0[0] or a fourth data signal O_DQo-0[0] to the processor 13 to be described later, as shown in FIG. 5. Similarly, the DQ signal input controller 20 performs, correspondingly to each of the plural DQ signal input controllers 20-0 to 20-k, a control to output a data signal DQ-0[k] inputted from the SDRAM 300-0 as a third data signal O_DQe-0[k] or a fourth data signal O_DQo-0[k] to the processor 13 to be described later.

In the control circuit unit 15-n, the plural DQ signal input controller 20 performs, correspondingly to each of the plural DQ signal input controllers 20-0 to 20-k, a control to output a data signal DQ-n[0] inputted from the SDRAM 300-n as a third data signal O_DQe-n[0] or a fourth data signal O_DQo-0[0] to the processor 13 to be described later, as shown in FIG. 6. Similarly, the DQ signal input controller 20 performs, correspondingly to each of the plural DQ signal input controllers 20-0 to 20-k, a control to output a data signal DQ-n[k] inputted from the SDRAM 300-n as a third data signal O_DQe-n[k] or a fourth data signal O_DQo-n[k] to the processor 13 to be described later.

Hereinafter, as reference character designating the third data signal, a reference character O_DQe-0[0], O_DQe-0[1], ... or O_DQe-0[k], or a reference character O_DQe-n[0], O_DQe-n[1], ... or O_DQe-0[k] is used when it is necessary to specify one of a plurality of the third data signals, whereas a reference character 0_DQe is used when an arbitrary third data is designated. Hereinafter, as reference character designating the fourth data signal, a reference character O_DQo-0[0], O_DQo-0[1], ... or O_DQo-0[k], or O_DQo-n[0], O_DQe-n[1], ... or O_DQo-n[k] is used when it is necessary to specify one of a plurality of the fourth data signals, whereas a reference character O_DQo is used when an arbitrary fourth data signal is designated.

Hereinafter, with respect to the data signal, when it is necessary to specify the third data signal and the fourth data signal, a reference character O_DQe, or O_DQe-0[0], O_DQe-0[1], ... or O_DQe-0[k], or O_DQe-n[0], O_DQe-n[1], ... or O_DQe-0[k] representing the third data signal, and a reference character O_DQo, or O_DQo-0[0], O_DQo-0[1], ... or O_DQo-0[k], or O_DQo-n[0], O_DQo-n[1], ... or O_DQo-n[k] representing the fourth data signal are used. When it is unnecessary to specify the third data signal and the fourth data signal, reference characters DQ-0[0] to DQ-0[k] and DQ-n[0] to DQ-n[k] designating data signals corresponding to the respective SDRAMs 300-0 to 300-n are used, whereas a reference character DQ is used when an arbitrary data signal is designated. When it is unnecessary to specify the third data signal and the fourth data signal, reference characters DQ-0 to DQ-n may be used instead of reference characters DQ-0[0] to DQ-0[k] and DQ-n[0] to DQ-n[k] designating data signals corresponding to the respective SDRAMs 300-0 to 300-n, for the sake of convenience.

In other words, the third data signals O_DQe-0[0] to O_DQe-0[k] corresponding to the SDRAM 300-0 correspond to the third data signal O_DQe, data signals DQ-0[0] to DQ-0[k], a data signal DQ-0 and a data signal DQ. The third data signals O_DQe-n[0] to O_DQe-n[k] corresponding to the SDRAM 300-n correspond to the third data signals O_DQe, data signals DQ-n[0] to DQ-n[k], a data signal DQ-n and a data signal DQ. The fourth data signals O_DQo-0[0] to O_DQo-0[k] corresponding to the SDRAM 300-0 correspond to the fourth data signal O_DQo, data signals DQ-0[0] to DQ-0[k], data DQ-0 and a data signal DQ. The fourth data signals 0_DQo-n[0] to O_DQo-n[k] corresponding to the SDRAM 300-n correspond to the fourth data signal O_DQo, data signals DQ-n[0] to DQ-n[k], data DQ-n and a data signal DQ.

The DQ signal input controller 20 has a flip-flop FF5, a variable delay circuit for input DR1, a flip-flop FF6, a flip-flop FF7, a variable delay circuit for input DR2 and a flip-flop FF8, as shown in FIGS. 5 and 6, for example.

When a data strobe signal DQS is inputted from the SDRAM 300 via a read-side DQS delay circuit DR0 to be described later, the flip-flop FF5 outputs a third data signal O_DQe inputted from the SDRAM 300 to the variable delay circuit for input DR1.

The variable delay circuit for input DR1 is formed of the variable delay circuit 100 according to the first embodiment described above. The variable delay circuit for input DR1 delays the third data signal O_DQe (corresponding to "IN" in FIG. 1) inputted from the flip-flop FF5 by an input delay amount set by an input delay amount setting section 24 to be described later, and outputs the data signal to the flip-flop FF6 (corresponding to "OUT" in FIG. 1).

In this embodiment, an input delay amount is set to each of the plural control circuit units 15-0 to 15-n. In concrete, an input delay amount Dt2-0 is set to the variable delay circuit for input DR1 in the control circuit unit 15-0. Similarly, an input delay amount Dt2-n is set to the variable delay circuit for input DR1 in the control circuit unit 15-n.

Hereinafter, as reference character designating the input delay amount, a reference character Dt2-0, Dt2-1, ... or Dt2-n is used when it is necessary to specify one of a plurality of the input delay amounts, whereas a reference character Dt2 is used when an arbitrary delay amount is designated.

In the variable delay circuit for input DR1 according to this embodiment, an input control signal d2 corresponds to the delay control signal SELdly, the first selection signal SELts and the second selection signal SELin in the first embodiment described above; and an input delay amount Dt2 corresponds to the delay amount TDL in the first embodiment described above.

In the variable delay circuit for input DR1 according to this embodiment, a first delay circuit (first input delay section) 101 is used, which can set the first delay amount DL1 (refer to the first embodiment described above) in eight stages from "0" to "7", where the maximum delay amount MDL is "7".

Into the variable delay circuit for input DR1 according to this embodiment, inputted are a plurality of timing signals CK3-0 to CK3-m taken out from the read-side DQS delay circuit DR, and these plural timing signals CK3-0 to CK3-m correspond to the plural timing signals TS0 to TSm in the first embodiment described above.

In this embodiment, these plural timing signals CK3-0 to CK3-m are taken out from predetermined positions in the read-side DQS delay circuit DR1 so that the timing signals CK3-0 to CK3-m ranging from the 0-th timing signals CK3-0 to the m-th timing signal CK3-m are delayed at intervals of 90 degrees in phase, and successively inputted to the variable delay circuit for input DR1.

Meanwhile, as a method of taking out these plural timing signals CK3-0 to CK3-m from the read-side DQS delay circuit DR0, any one of various known techniques is employable.

In the drawings, the plural timing signals CK3-0 to CK3-m are designated by a reference character CK3, for the sake of convenience.

The variable delay circuit for input DR1 has a first delay circuit (first input delay section) 101 which delays a data signal DQ by a first delay amount (first input delay amount) DL1, a second delay circuit (second input delay section) 102 which delays the data signal DQ by a second delay amount (second input delay amount) DL2 greater than the first delay amount DL1 and a selector (input delay amount selector) 103 which selects a signal route where an input delay amount Dt2 is a sum of the first delay amount DL1 and the second delay amount DL2 when the input delay amount Dt2 exceeds the maximum delay amount (maximum input delay amount) MDL delayable by the first delay circuit 101 (refer to FIG. 1).

In the second delay circuit 102, a selector (selecting circuit for input) 104 selects any one of the plural kinds of timing signals CK3-0 to CK3-m having different phases on the basis of the input delay amount Dt2, and a D flip-flip (sequential circuit for input) 105 delays the data signal DQ by the second delay amount DL2 according to the timing signal selected by the elector 104 (refer to FIG. 1).

When the clock signal CK1 is inputted from the first clock signal generator 14, the flip-flop FF6 outputs the third data signal O_DQe inputted from the variable delay circuit for input DR1 to the processor 13 to be described later.

When the data strobe signal DQS is inputted from the SDRAM 300 via the read-side DQS delay circuit DR0 to be described later, the flip-flop FF7 outputs the fourth data signal O_DQo inputted from the SDRAM 300 to the variable delay circuit for input DR2.

The variable delay circuit for input DR2 is formed of the variable delay circuit 100 according to the first embodiment described hereinbefore. The variable delay circuit for input DR2 delays the fourth data signal O_DQo inputted from the flip-flop FF7 by an input delay amount Dt2 set by the input delay amount setting section 24 to be described later on the basis of an input control signal d2 from the input delay amount setting section 24 to be described later, and outputs the fourth data signal O_DQo to the flip-flop FF8.

Incidentally, the variable delay circuit for input DR2 is configured similarly to the variable delay circuit for input DR1 described above, detailed description of which is thus omitted here.

In this embodiment, the same input delay amount Dt2 is set to each of the plural SDRAMs 300-0 to 300-n.

In concrete, an input delay amount Dt2-0 is set to each of the variable delay circuits for input DR1 and DR2 provided in the control circuit unit 15-0 shown in FIG. 5. Similarly, an input delay amount Dt2-n is set to each of the variable delay circuits for input DR1 and DR2 provided in the control circuit unit 15-n shown in FIG. 6.

Hereinafter, as reference character designating the variable delay circuit for input, reference characters DR1, DR2 or the like are used when it is necessary to specify one of a plurality of the variable delay circuits for input, whereas a reference character DR is used when an arbitrary variable delay circuit for input is designated.

In the following description, reference character DR-1 may be used to designate a variable delay circuit for input corresponding to the SDRAM 300-0 of the 1-ch. Similarly, a reference character DR-n may be used to designate a variable delay circuit for input corresponding to the SDRAM 300-n of the n-ch.

When a clock signal CK1 is inputted from the first clock signal generator 14, the flip-flop FF8 outputs the fourth data signal O_DQo inputted from the variable delay circuit for input DR2 to the processor 13 to be described later.

The OR circuit OR outputs a response signal (for example, a High signal) to the processor 13 to be described later on the basis of the third data signal O_DQe and the fourth data signal O_DQo when the write leveling function to be described later is used.

In concrete, when any one of the plural third data signals O_DQe-0[0] to O_DQe-0[k] corresponding to the SDRAM 300-0 and the plural fourth data signals O_DQo-0[0] to O_DQo-0[k] corresponding to the SDRAM 300-0 is inputted, the OR circuit OR provided in the control circuit unit 15-0 outputs a response signal O_DQX-0 to the processor 13 to be described later if using the write leveling function to be described later, as shown in FIG. 5, for example.

Likewise, when any one of the plural third data signals O_DQe-n[0] to O_DQe-n[k] corresponding to the SDRAM 300-n and the plural fourth data signals O_DQo-n[0] to O_DQo-n[k] corresponding to the SDRAM 300-n is inputted, the OR circuit OR provided in the control circuit unit 15-n outputs a response signal O_DQX-n to the processor 13 to be described later if using the write leveling function, as shown in FIG. 6.

Hereinafter, as reference character designating the response signal, a reference character O_DQX-0, O_DQX-1, . . . or O_DQX-n is used when it is necessary to specify one of the plural response signals, whereas a reference character O_DQX is used when an arbitrary response signal is designated.

The processor 13 performs various numerical value calculations, information processing and equipment control, etc. in the information processing apparatus 10a. In this embodiment, the processor 13 functions as a delay time controller 22 (refer to FIG. 4). The processor 13 has an MAC (Media Access Control; not shown). The processor 13 inputs/outputs various kinds of signals (data signal DQ, clock signal CLK, response signal DQX, etc.) via the MAC.

The delay time controller 22 outputs a control signal for setting a delay amount to each of the variable delay circuits for output DW and the variable delay circuits for input DR provided in each of the control circuit units 15-0 to 15-n. As shown in FIG. 4, the delay time controller 22 has an output delay amount setting section 23 and an input delay amount setting section 24.

The output delay amount setting section 23 controls the variable delay circuit for output DW provided in each of the control circuit units 15-0 to 15-n to delay by an output delay amount Dt1, with the use of the write leveling function. The output delay amount setting section 23 outputs an output control signal d1 for setting the output delay amount Dt1. In this embodiment, the output delay amount setting section 23 sets output delay amounts Dt1-0 to Dt1-n of data strobe signals DQS-0 to DQS-n for the plural SDRAMs 300-0 to 300-n at the time of write operation, with the use of the write leveling function.

The write leveling function is a function of adjusting (correcting) each of the data strobe signals DQS-0 to DQS-n so that the data strobe signals DQS-0 to DQS-n are inputted to the plural SDRAMs 300-0 to 300-n in synchronization with or almost in synchronization with the clock signal CK1. This function is realized by setting the output delay amounts Dt1-0 to Dt1-n of the data strobe signals DQS-0 to DQS-n to be outputted to the respective SDRAMs 300-0 to 300-n, to which the clock signal line is wired in a daisy chain, on the basis the data signals DQ-0 to DQ-n outputted from the SDRAMs 300-0 to 300-n, respectively.

Figure 7:
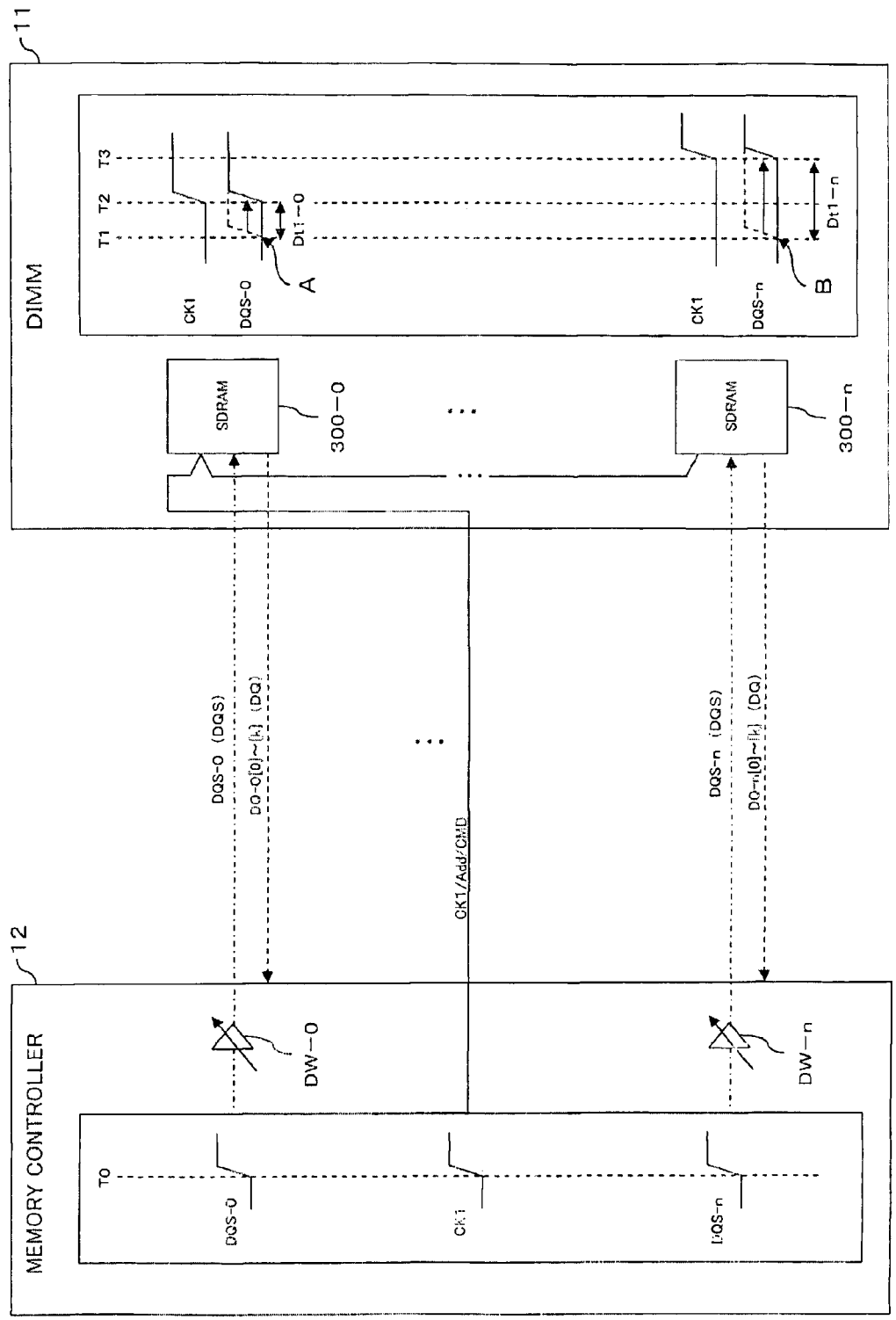
FIG. 7 is a diagram for illustrating the write leveling function in an output delay amount setting section of the information processing apparatus according to the second embodiment of this invention.

FIG. 7 is a diagram for illustrating the write leveling function in the output delay amount setting section of the information processing apparatus according to the second embodiment.

Hereinafter, setting of the output delay amounts Dt1-0 to Dt1-n for the respective SDRAMs 300-0 to 300-n with use of the write leveling function in the output delay amount setting section 23 will be described by way of example where an output delay amount Dt1-0 for the SDRAM 300-0 of the 0-ch and a delay amount Dt1-n for the SDRAM 300-n of the n-ch are set as shown in FIG. 7.

When a clock signal CK1 and a data strobe signal DQS (DQS-0 and DQS-n in the example shown in FIG. 7) are inputted to the each of the SDRAMs (the SDRAM 300-0 and the SDRAM 300-n in the example shown in FIG. 7) simultaneously or almost simultaneously, each of the SDRAMs outputs a data signal DQ (DQ-0[0] to DQ-0[k] and DQ-n[0] to DQ-n[k] in the example shown in FIG. 7) to the memory controller 12.

First, the memory controller 12 outputs a clock signal CK1 to each of the SDRAMs (the SDRAM 300-0 and the SDRAM 300-n in the example shown in FIG. 7), and, simultaneously or almost simultaneously, outputs a data strobe signal DQS (DQS-0 and DQS-n in the example shown in FIG. 7) to each of the SDRAMs (the SDRAM 300-0 and the SDRAM 300-n in the example shown in FIG. 7) (refer to a time "T0" in FIG. 7).

For example, before the output delay amount Dt1 is adjusted by the write leveling function, the clock signal CK1 is delayed by a time Dt1-0 from when a data strobe signal DQS-0 is inputted (refer to a time "T1" and a point "A" in FIG. 7), and inputted to the SDRAM 300-0 of the 0-ch (refer to a time "T2" in FIG. 7), as shown in FIG. 7. On the other hand, the clock signal CK1 is delayed by a time Dt1-n from when a data strobe signal DQS-n is inputted (refer to a time "T1" and a point "B" in FIG. 7), and inputted to the SDRAM 300-n of the n-ch (refer to a time "T3" in FIG. 7).

In this case, an output delay amount Dt1-0 is set to the variable delay circuit for output DW-0 (refer to a time "T2" in FIG. 7) so that the data strobe signal DQS-0 and the clock signal CK1 are inputted simultaneously or almost simultaneously to the SDRAM 300-0 of the 0-ch. On the other hand, an output delay amount Dt1-n is set to the variable delay circuit for output DW-n (refer to a time "T3" in FIG. 7) so that the data strobe signal DQS-n and the clock signal CK1 are inputted simultaneously or almost simultaneously to the SDRAM 300-n of the n-ch.

More specifically, in the SDRAM 300-0 of the 0-ch, the output delay amount setting section 23 (not shown in FIG. 7) gradually extends the delay time of the variable delay circuit for output DW-0 until the clock signal CK1 and the data strobe signal DQS-0 are inputted simultaneously or almost simultaneously, and sets a time for which any one of data signals DQ-0[0] to DQ-0[k] from the SDRAM 300-0 is inputted to the OR circuit OR-0 and a response signal O_DQX-0 is thereby outputted from the OR circuit OR-0 as a delay amount Dt1-0 to the variable delay circuit for output DW-0.

On the other hand, in the SDRAM 300-n of the n-ch, the output delay amount setting section 23 (not shown in FIG. 7) gradually extends the delay time of the variable delay circuit for output DW-n until the clock signal CK1 and the data strobe signal DQS-n are inputted simultaneously or almost simultaneously, and sets a time for which any one of data signals DQ-n[0] to DQ-n[k] from the SDRAM 300-n is inputted to the OR circuit OR-n and a response signal O_DQX-n is thereby outputted from the OR circuit OR-n as an output delay amount Dt1-n to the variable delay circuit for output DW-n.

Accordingly, the output delay amounts Dt1-0 to Dt1-n for the respective SDRAMs 300-0 to 300-n are so set as to be gradually increased in the ascending order of the SDRAM 300-0 of the 0-ch to the SDRAM 300-n of the n-ch.

The output delay amount setting section 23 outputs output control signals d1 to the variable delay circuits for output DW-0 to DW-n so as to achieve the set output delay amounts Dt1-0 to Dt1-n, respectively. The variable delay circuits for output DW-0 to DW-n delay the data strobe signals DQS-0 to DQS-n by the output delay amounts Dt1-0 to Dt1-n on the basis of these control signals d1, respectively.

Namely, at the time of writing operation, the variable delay circuit for output DW delays a data strobe signal DQS to be outputted to the SDRAM 300 by an output delay amount Dt1 set with use of the write leveling function.

Figure 8:
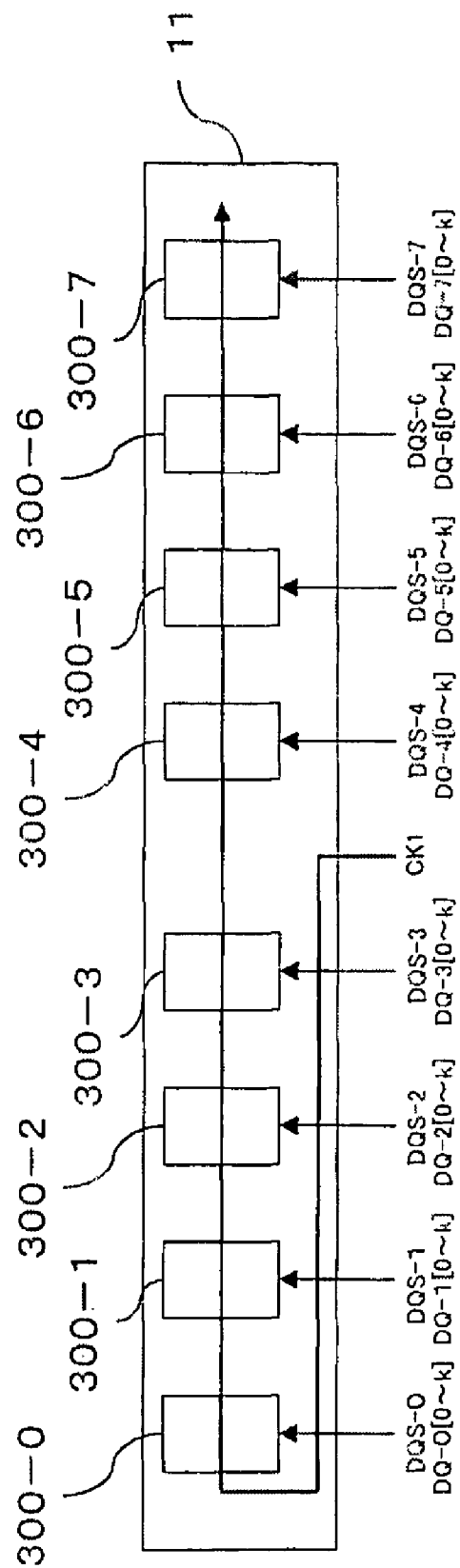
FIG. 8 is a diagram for illustrating the order in which delay amounts are set in the output delay amount setting section of the information processing apparatus according to the second embodiment of this invention.
Figure 9:
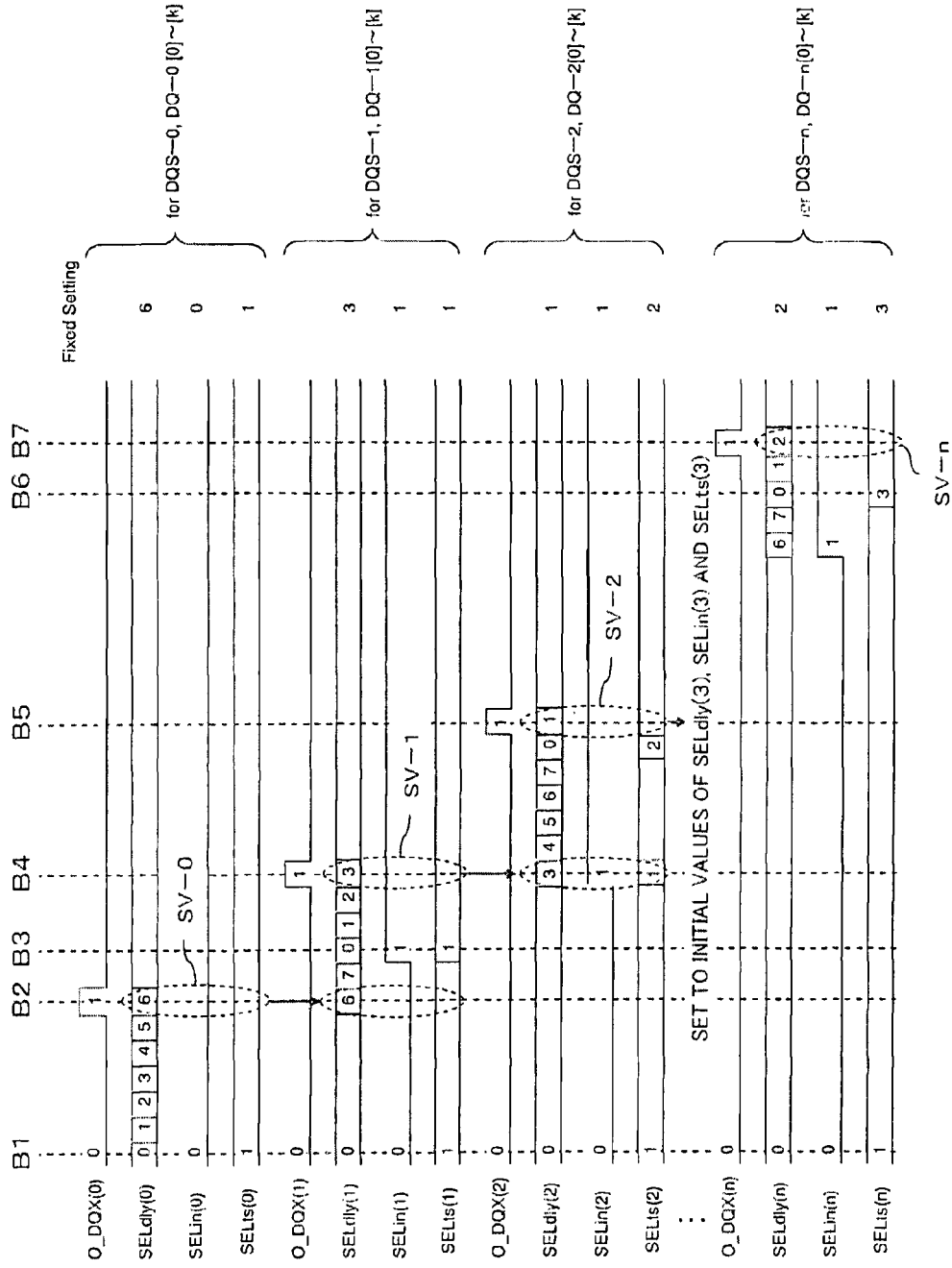
FIG. 9 is a timing chart showing the order in which delay amounts are set in the output delay amount setting section of the information processing apparatus according to the second embodiment of this invention.

FIG. 8 is a diagram for illustrating the order in which the delay amounts are set by the output delay amount setting section in the information processing apparatus according to the second embodiment of this invention. FIG. 9 is a timing chart showing the order in which the delay amounts are set.

The output delay amount setting section 23 successively sets the output delay amounts Dt1-0 to Dt1-n for the respective SDRAM 300-0 to 300-n in order along a wiring route of the clock signal line. In the example (Unbuffered DIMM) shown in FIG. 8, the output delay amount setting section 23 sets the output delay amounts in the order of the output delay amount Dt1-0, the output delay amount Dt1-1, the output delay amount Dt1-2, the output delay amount Dt1-3, the output delay amount Dt1-4, the output delay amount Dt1-5, the output delay amount Dt1-6 and the output delay amount Dt1-7, starting with the delay amount Dt1-0 for the SDRAM 300-0 to which the clock signal CK1 is first inputted and ending with the output delay amount Dt1-7 for the SDRAM 300-7 to which the clock signal CK1 is finally inputted.

The output delay amount setting section 23 employs an output delay amount Dt1 (for example, Dt1-1) having been set for one SDRAM (for example, the SDRAM 300-1) neighboring another SDRAM (for example, SDRAM 300-2) as a start delay amount Dt1st, and changes step-wise the start delay amount to set an output delay amount Dt1 (for example, Dt1-2) to be set for the another SDRAM 300 (for example, 300-2).

In the example shown in FIG. 9, the output delay amount setting section 23 first outputs an output control signal d1 to the variable delay circuit for output DW-0 corresponding to the SDRAM 300-0 of the 0-ch, sets a setting value "0" (refer to a time "B1" in FIG. 9) to the output delay amount Dt1-0 of the variable delay circuit for output DW-0, increases step-wise the setting value from "0" to "1", "2", "3", "4", "5" and "6", and sets a setting value SV-0 obtained when the response signal O_DQX-0 is outputted from the OR circuit OR-0 as the output delay amount Dt1-0 (refer to a time "B2" in FIG. 9).

Incidentally, the setting value SV-0 is a setting value of the output delay amount Dt1-0 for the SDRAM 300-0, comprised of "SELdly(0)", "SELin(0)" and "SELts(0)", as shown in FIG. 9. Similarly, the setting values SV-1 to SV-n are setting values of the output delay amounts Dt1-1 to Dt1-n for the respective SDRAMs 300-1 to 300-n, comprised of "SELdly (1)", SELin(1) and "SELts(1)" to "SELdly(n)", "SELin(n)" and "SELts(n).

"SELdly(0)" is value for setting the delay amount DL1 (refer to the above first embodiment) of a signal (refer to a reference character "IN" in FIG. 1) inputted to the variable delay circuit for output DW-0 to the first delay circuit 101 (refer to FIG. 1). In this embodiment, this value represents the number of delay elements configuring the first delay circuit 101 through which the signal inputted to the variable delay circuit for output DW-0 passes. "SELdly(1)" to "SELdly(n)" are the same as the above "SELdly(0)".

"SELin(0)" is a value for setting a signal route of a signal inputted to the variable delay circuit for output DW-0 to the selector 103 (refer to FIG. 1). In this embodiment, a value "0" represents that a signal route leading a signal inputted to the variable delay circuit DW-0 directly to the selector 103 is selected. A value "1" represents that a signal route leading a signal inputted to the variable delay circuit for output DW-0 to the selector 103 via the second delay circuit 102 is selected. "SELin(1)" to "SELin(n)" are the same as the above "SELin(0)".

"SELts(0)" is a value for setting one clock signal selected among a plurality of clock signals CK1-0 to CK1-m to the selector 104 (refer to FIG. 1). In this embodiment, a value "0" represents that the 0-th clock signal CK1-0 is selected. Similarly, a value "1" represents that the first clock signal CK1-1 is selected, and a value "n" represents that the n-th clock signal CK1-n is selected. "SELts(1)" to "SELts(n)" are the same as the above "SELts(0)".

With respect to the setting value SV-0, "SELdly(0) is set to a value "6", "SELin(0)" to a value "0", and "SELts(0) to a value "1".

The output delay amount setting section 23 employs a setting value SV-0 set as the output delay amount Dt1-0 for the SDRAN 300-0 of the 0-ch as the start delay amount Dt1st (refer to a time "B2" in FIG. 9), and thereby sets an output delay amount Dt1-1 for the SDRAM 300-1 of the 1-ch. In concrete, the output delay amount setting section 23 outputs an output control signal d1 to the variable delay circuit for output DW-1 corresponding to the SDRAM 300-1 of the 1-ch to increase step-wise the output delay amount Dt1-1 of the variable delay circuit for output DW-1 from the start delay amount Dt1st (setting value SV-0; refer to a time "B2" in FIG. 9), and sets a setting value SV-1 obtained when a response signal O_DQX-1 is outputted from the OR circuit OR-1 as the output delay amount Dt1-1 (refer to a time "B4" in FIG. 9).

In this case, the output delay amount setting section 23 resets the delay amount DL1 of the first delay circuit 101 (DL1="0") when the delay amount TDL exceeds the maximum delay amount MDL ("7" in this embodiment), and outputs an output control signal d1 ("SELin(1)"="1") to switch the signal route to a signal route of the signal where the delay amount TDL is a sum of the first delay amount DL1 and the second delay amount DL2 (in this case, the 0-th clock signal CK1-0) (refer to a time "B3" in FIG. 9).

Accordingly, in the example shown in FIG. 9, as the setting value SV-1, "SELdly(1)" is set to a value "3", "SELin(1)" to a value "1", and "SELts(1)" to a value "1".

Similarly, with respect to the output delay amounts Dt1-2 to Dt1-n for the SDRAM 300-2 to 300-n of the 2-ch, the output delay amount setting section 23 employs an output delay amount Dt1-1, Dt1-2, . . . or Dt1-n-1 (setting values SV-1 to SV-n-1; as the setting value SV-1, refer to a time "B4" in FIG. 9) for the preceding SDRAM 300-1, 300-2, . . . or 300-n-1 as the start delay amount Dt1st, increases step-wise each of the output delay amounts Dt1-1 to Dt1-n-1 from the start delay amount Dt1st, and sets a setting value SV-2, SV-3, . . . or SV-n obtained when a response signal O_DQX-2, O_DQX-3, . . . or O_DQX-n is outputted from the OR circuit OR-2, OR-3, . . . or OR-n as the output delay amount Dt1-2, Dt1-3, . . . or Dt1-n (refer to times "B5" and "B7" in FIG. 9).

The output delay amount setting section 23 resets the delay amount DL1 of the first delay circuit 101, with a route for the signal where the delay amount TDL is a sum of the first delay amount DL1 and the second delay amount DL2 being selected, whenever the delay amount TDL exceeds the maximum delay amount MDL, and outputs the output control signal d1 (for example, "SELts(n)"="p") for switching the current clock signal (for example, the p-1 (where p is a natural number from 1 to n)) for the second delay amount DL2 to the next clock signal (for example, the p-th clock signal CK1-p) (refer to a time "B5" and a time "B6" in FIG. 9).

In consequence, with respect to the setting value SV-2, "SELdly(2)" is set to a value "1", "SELin(2)" to a value "1" and "SELts(2)" to a value "2". With respect to the setting value SV-n, "SELdly(n)" is set to a value "2", "SELin(n)" to a value "1" and "SELts(n)" to a value "3".

As above, the output delay amount setting section 23 sets an output delay amount Dt1 to be set for one SDRAM 300 on the basis of an output delay amount Dt1 that has been already set for another SDRAM 300.

Figure 10:
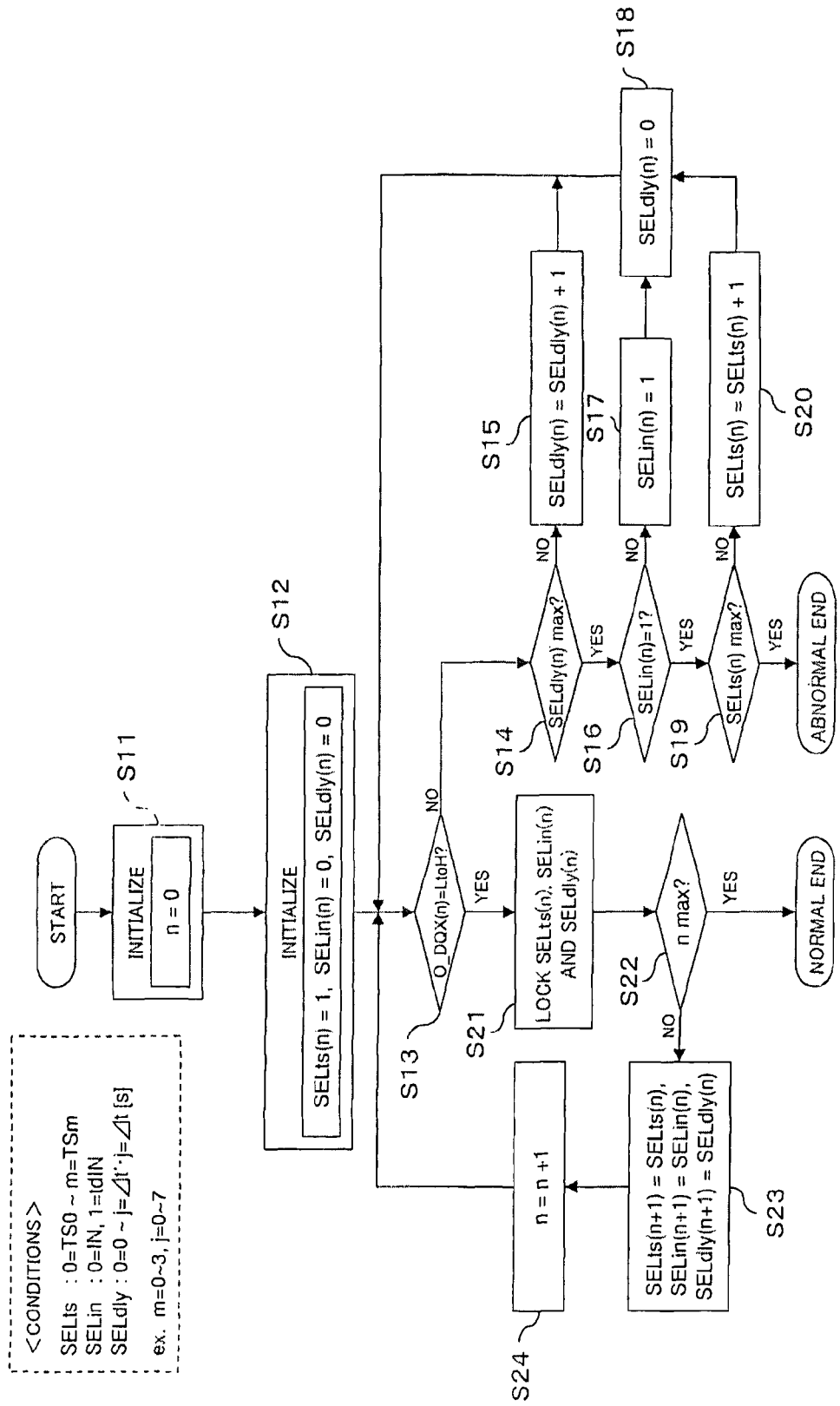
FIG. 10 is a flowchart showing the order in which output delay amounts are set in the output delay amount setting section of the information processing apparatus according to the second embodiment of this invention.

Hereinafter, a sequence of setting output delay amounts Dt1-0 to Dt1-n for a plurality of the SDRAMs 300-0 to 300-n in the output delay amount setting section 23 will be described with reference to a flowchart (steps S11 to S24) shown in FIG. 10.

First, the output delay amount setting section 23 initializes a variable "n" indicating an SDRAM 300 to be set (n=0; step S11), and initializes variables "SELdly(n)", "SELin(n)" and "SELts(n)" together indicating an output control signal d1 (SELdly(n)=0, SELin(n)=0 and SELts(n)=1; step S12).

Next, the output delay amount setting section 23 determines whether a response signal O_DQX-n transits from "Low" to "High" (step S13). When the response signal O_DQX-n does not transit from "Low" to "High" (refer to "NO" route at step S13), the output delay amount setting section 23 determines whether the variable "SELdly(n)" is maximum or not (step S14).

When the variable "SELdly(n)" is not maximum (refer to "NO" route at step S14), the output delay amount setting section 23 adds a value "1" to the variable "SELdly(n)" (step S15), and returns to step S13.

When the variable "SELdly(n)" is maximum (refer to "YES" route at step 514) the output delay amount setting section 23 determines whether the variable "SELin(n)" is a value "1" (step S16).

When the variable "SELin(n)" is not a value "1" (refer to "NO" route at step S16), the output delay amount setting section 23 sets the variable "SELin(n)" to a value "1" (step S17), resets the variable "SELdly(n)" (SELdly(n)=0), and returns to step S13.

When the variable "SELin(n)" is a value "1" (refer to "YES" route at step S16), the output delay amount setting section 23 determines whether the variable "SELts(n)" is maximum or not (step S19).

When the variable "SELts(n)" is not maximum (refer to "NO" route at step S19), the output delay amount setting section 23 adds a value "1" to the variable "SELts (n)" (step S20), resets the variable "SELdly(n)" (SELdly(n)=0) (step S18), and returns to step S13.

When the variable "SELts(n)" is maximum (refer to "YES" route at step S19), the output delay amount setting section 23 cannot add a desired delay amount because the variables "SELdly(n)", "SELin(n)" and "SELts(n)" exceed the setting range. Hence, the procedure returns to step S11 to execute again the operation or an alarm is generated, and the process is terminated (abnormal end).

When the response signal O_DQX-n transits from "Low" to "High", that is, when the response signal O_DQX-n is received (refer to "YES" route at step S13) the output delay amount setting section 23 locks the values set to the variable "SELdly(n)", "SELin(n)" and "SELts(n)" (holds a state immediately before) (step S21).

The output delay amount setting section 23 determines whether the variable "n" is maximum or not (step S22).

When the variable "n" is not maximum (refer to "NO" route at step S22), the output delay amount setting section 23 sets values of the variables "SELdly(n)", "SELin(n)" and "SELts(n)" locked at step S21 to the variables "SELdly(n+1)", "SELin(n+1)" and "SELts(n+1)" (step S23), adds a value "1" to the variable "n" (step S24), shifts to the next SDRAM, and returns to step S13.

When the variable "n" is maximum (refer to "YES" route at step S22), the output delay amount setting section 23 terminates the process (normal end).

As above, output delay amounts Dt1-0 to Dt1-n are set to all the SDRAMs 300-0 to 300-n.

The input delay amount setting section 24 controls the variable delay circuits DR provided in each of the control circuit units 15-0 to 15-n to delay by the input delay amount Dt2 on the basis of output delay amounts Dt1-0 to Dt1-n set by the output delay amount setting section 23. The input delay amount setting section 24 outputs an input control signal d2 ("SELdly(n)", "SELin(n)" and "SELts(n)") for setting the input delay amount Dt2. In this embodiment, the input delay amount setting section 24 calculates and sets input delay amounts Dt2 for data signals DQ-o to DQ-n inputted from the respective plural SDRAMs 300-0 to 300-n at the time of read operation on the basis of the output delay amounts Dt1-0 to Dt1-n set by the output delay amount setting section 23.

In the input delay amount setting section 24 according to this embodiment, an input delay amount Dt2-x for one SDRAM 300-x (x being a variable from 0 to n) is set such that a sum of an output delay amount Dt1-x and an input delay amount Dt2-x for this SDRAM is equal to a sum of an output delay amount Dt1-y and an input delay amount Dt2-y for another SDRAM 300-y (y being a variable from 0 to n).

Namely, input delay amounts Dt2-0 to Dt2-n for the respective SDRAMs 300-0 to 300-n are so set as to be decreased in the order of the SDRAM 300-0 of the 0-ch to the SDRAM 300-n of the n-ch.

The input delay amount setting section 24 outputs input control signals d2 to the variable delay circuits for input DR-0 to DR-n so as to achieve the set input delay amounts Dt2-0 to Dt2-n therein. The variable delay circuits for input DR-0 to DR-n delay data signals DQ-0 to DQ-n by the input delay amounts Dt2-0 to Dt2-n on the basis of these input control signals d2, respectively.

In other words, the variable delay circuit for input DR delays, at the time of read operation, a data signal DQ inputted from the SDRAM 300 by an input delay amount Dt2 set according to an output delay amount Dt1 of a data strobe signal DQS outputted to the SDRAM set with the use of the write leveling function.

As stated above, the information processing apparatus 10a according to the second embodiment of this invention generates a plurality of the clock signals CK1-0 to CK1-m having different phases and a plurality of the timing signals CK3-0 to CK3-m having different phases from the existing circuits in the memory controller 12, hence can suppress the circuit scale and decrease the power consumption, while providing the same working effects as the above-mentioned first embodiment of this invention.

Input delay amounts Dt2 of data signals DQ inputted from the SDRAMs 300 are set for the SDRAMs 300-0 to 300-n wired by the clock signal line in a daisy chain on the basis of output delay amounts Dt1 set with the use of the write leveling function, whereby input times of the data signals DQ outputted from the plural SDRAMs 300-0 to 300-n wired by the clock signal line in a daisy chain can be readily arranged. Accordingly, it is possible to prevent disorder due to propagation delay of the data signals DQ when a control of the read operation is performed.

[3] First Modification of Second Embodiment of the Invention

Next, description will be made of an information processing apparatus 10b according to a first modification of the second embodiment of this invention with reference to FIG. 11.

Figure 11:
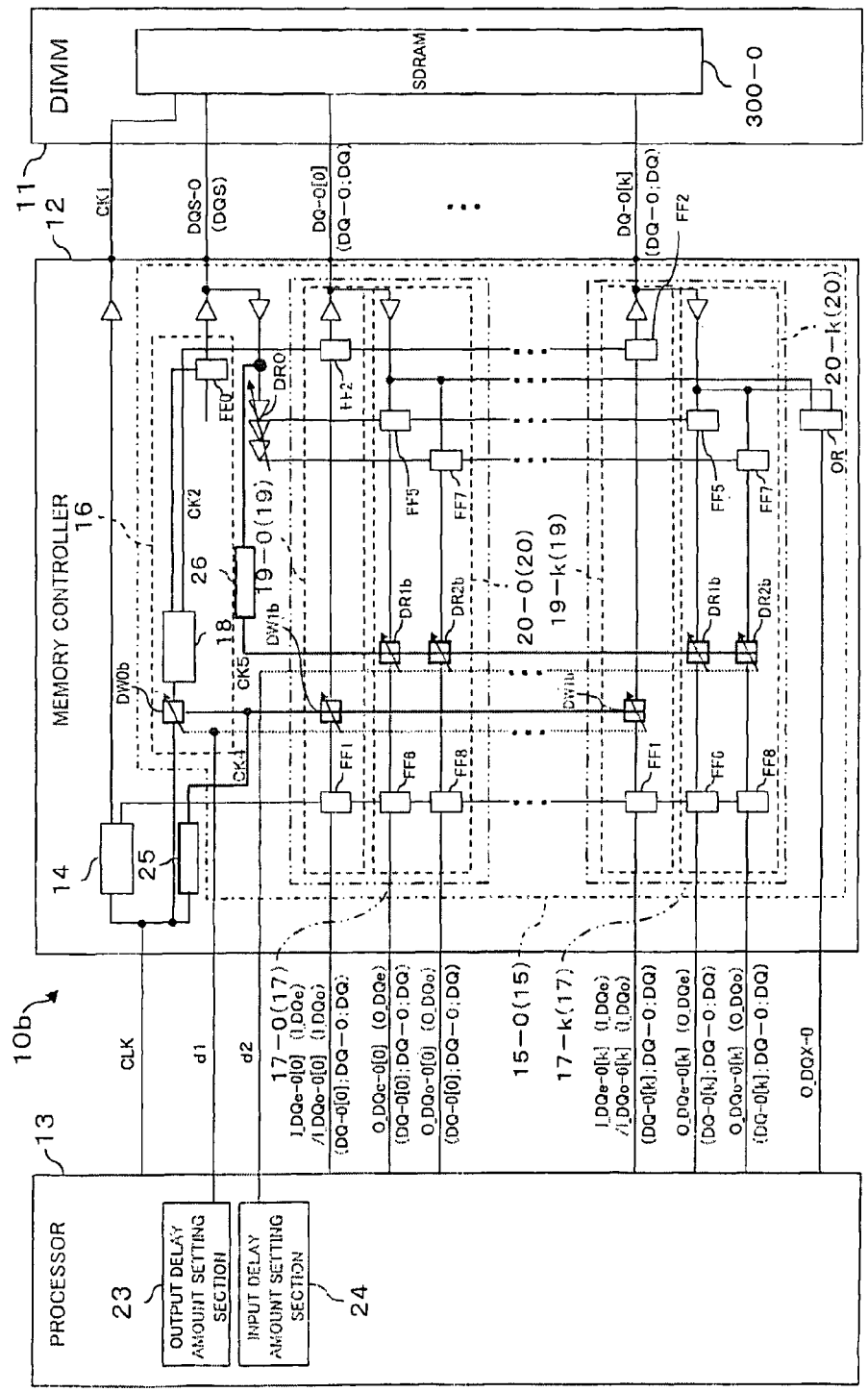
FIG. 11 is a diagram schematically showing one example of the circuit configuration of a memory controller in an information processing apparatus according to a first modification of the second embodiment of this invention.

FIG. 11 is a diagram schematically showing one example of the circuit configuration of a memory controller in the information processing apparatus according to the first modification of the second embodiment of this invention.

As shown in FIG. 11, the information processing apparatus 10b according to the first modification of the second embodiment of this invention has variable delay circuits for output DW0b and DW1b and variable delay circuits for input DR1b and DR2b instead of the variable delay circuits for output DW0 and DW1 and the variable delay circuits for input DR1 and DR2, along with a fourth clock signal generator 25 and a fifth clock signal generator 26 in the memory controller 12. Other parts of the information processing apparatus lob are configured similarly to those of the information processing apparatus 10a according to the second embodiment.

In the drawing, like reference characters designate like or corresponding parts, detailed descriptions of which are thus omitted here.

In FIG. 11, the clock signal line and the signal line for outputting the address signal Add and the command signal CMD are connected to positions in the vicinity of an end of the DIMM 11 (upper part of the paper), for the sake of convenience. Actually, these signal lines are connected to the middle portion (the middle of the paper) of the DIMM 11, as shown in FIG. 3.

The fourth clock signal generator 25 generates a clock signal CK4 in a predetermined cycle on the basis of the clock signal CLK inputted from the processor 13, and outputs the clock signal CK4. The fourth clock signal generator 25 may output a clock signal in the same cycle as the clock signal CLK, or may output a clock signal CK4 whose clock cycle is converted to another cycle such as ½, ¼ or the like of the cycle of the clock signal CLK.

The fifth clock signal generator 26 generates a clock signal CK5 in a predetermined cycle on the basis of the data strobe signal DQS inputted from the SDRAM 300, and outputs the clock signal CK5.

Like the variable delay circuit for output DW0 according to the above-mentioned second embodiment, the variable delay circuit for output DW0b is formed of the variable delay circuit 100 according to the first embodiment.

In the first modification, a plurality of clock signals CK4-0 to CK4-m taken out from the fourth clock signal generator 25 are inputted to the variable delay circuit for output DW0b, unlike the variable delay circuit for output DW0 according to the second embodiment described above. These plural clock signals CK4-0 to CK4-m correspond to the plural timing signals TS0 to TSm in the first embodiment described above.

These plural clock signals CK4-0 to CK4-m are taken out from predetermined positions in the fourth clock signal generator 25 so that the clock signals CK4-0 to CK4-m ranging from the 0-th clock signals CK4-0 to the m-th clock signal CK4-m are delayed at intervals of 90 degrees in phase, and successively inputted to the variable delay circuit for output DW0b, like the plural clock signals CK1-0 to CK1-m in the second embodiment described above.

Other parts of the variable delay circuit for output DW0b have similar functions and configurations to those of the variable delay circuit for output DW0 according to the above-mentioned second embodiment, detailed descriptions of which are thus omitted here.

Like the variable delay circuit for output DW1 according to the above-mentioned second embodiment, the variable delay circuit for output DW1b formed of the variable delay circuit 100 according to the first embodiment. The variable delay circuit for output DW1 delays a first input data signal I_DQe or a second data signal I_DQo inputted from the flip-flop FF1 by an output delay amount Dt1 set by the output delay amount setting section 23 on the basis of an output control signal d1 from the output delay amount setting section 23, and outputs the data signal to the flip-flop FF2.

The variable delay circuit for output DW1b is configured similarly to the variable delay circuit for output DW0b, detailed description of which is thus omitted here.

Like the variable delay circuit for input DR1 according to the above-mentioned second embodiment, the variable delay circuit for input DR1b formed of the variable delay circuit 100 according to the first embodiment.

In the first modification, a plurality of clock signals CK5-0 to CK5-m taken out from the fifth clock signal generator 26 are inputted to the variable delay circuit for input DR1b, unlike the variable delay circuit for input DR1 according to the above-mentioned second embodiment. These plural clock signals CK5-0 to CK5-m correspond to the plural timing signals TS0 to TSm in the first embodiment described above.

Like the plural timing signals CK3-0 to CK3-m in the above-mentioned second embodiment, these plural clock signals CK5-0 to CK5-m are taken out from predetermined positions of the fifth clock signal generator 25 so that the clock signals CK5-0 to CK5-m ranging from the 0-th clock signals CK5-0 to the m-th clock signal CK5-m are delayed at intervals of 90 degrees in phase, and successively inputted to the variable delay circuit for input DR1b.

Other parts of the variable delay circuit for input DR1b have similar functions and configurations to those of the variable delay circuit for input DR1 in the above-mentioned second embodiment, detailed descriptions of which are thus omitted here.

Like the variable delay circuit for input DR2 according to the above-mentioned second embodiment, the variable delay circuit for input DR2b formed of the variable delay circuit 100 according to the first embodiment described above. The delay circuit for input DR2b delays a fourth data signal O_DQo inputted from the flip-flop FF7 by an input delay amount Dt2 set by the input delay amount setting section 24 on the basis of an input control signal d2 from the input delay amount setting section 24, and inputs the data signal to the flip-flop FF8.

The variable delay circuit for input DR2b is configured similarly to the above-described variable delay circuit for input DR1b, detailed description of which is thus omitted here.

The information processing apparatus 10b according to the first modification of the second embodiment of this invention can generate a plurality of clock signals CK4-0 to CK4-m and CK5-0 to CK5-m having different phases more freely than a case where the clock signals are generated from the circuits in the memory controller 12, while providing the same working effects as the above-mentioned second embodiment.

[4] Second Modification of Second Embodiment of the Invention

Next, description will be made of an information processing apparatus 10c according to a second modification of the second embodiment of this invention with reference to FIG. 12.

Figure 12:
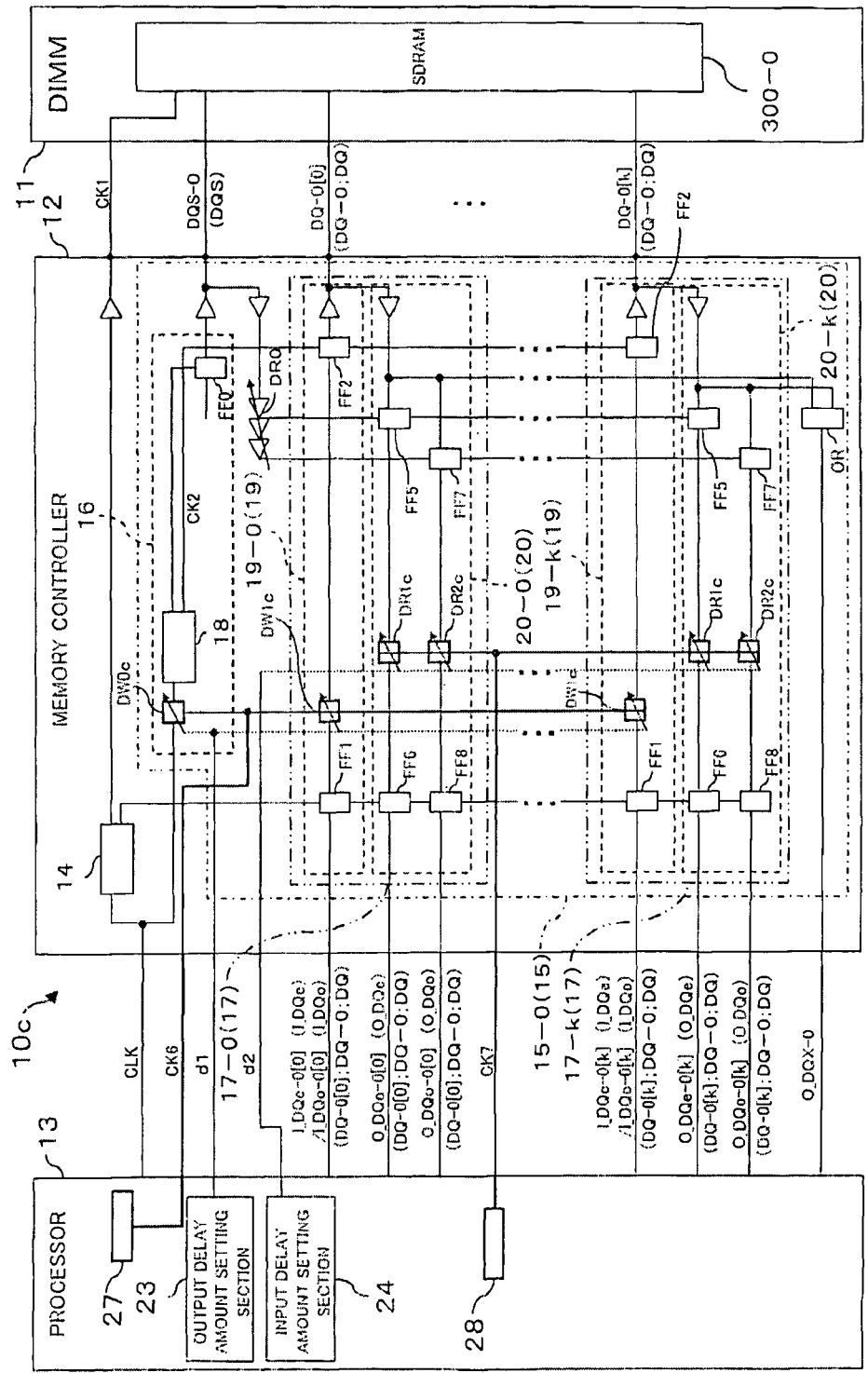
FIG. 12 is a diagram schematically showing one example of the circuit configuration of a memory controller in the information processing apparatus according to a second modification of the second embodiment of this invention.

FIG. 12 is a diagram schematically showing one example of the configuration of a memory controller in the information processing apparatus according to the second modification of the second embodiment of this invention.

As shown in FIG. 12, the information processing apparatus 10c according to the second modification of the second embodiment of this invention has variable delay circuits for output DW0c and DW1c and variable delay circuits for input DR1c and DR2c instead of the variable delay circuits for output DW0 and DW1 and the variable delay circuits for input DR1 and DR2, along with a sixth clock signal generator 27 and a seventh clock signal generator 28 in the processor 13. Other parts of the information processing apparatus 10c are configured similarly to those of the information processing apparatus 10a according to the second embodiment.

In the drawing, like reference characters designate like or corresponding parts, detailed descriptions of which are thus omitted here.

In FIG. 12, the clock signal line and a signal line for outputting the address signal Add and the command signal CMD are connected to positions in the vicinity of an end of the DIMM 11 (upper part of the paper), for the sake of convenience. Actually, these signal lines are connected to the middle portion (the middle of the paper) of the DIMM 11, as shown in FIG. 3.

The sixth clock signal generator 27 generates and outputs a clock signal CK6 in a predetermined cycle for performing a control by the processor 13. The seventh clock signal generator 28 generates and outputs a clock signal CK7 in a predetermined cycle for performing a control by the processor 13.

Like the variable delay circuit for output DW0 in the above-mentioned second embodiment, the variable delay circuit for output DW0c is formed of the variable delay circuit 100 according to the first embodiment.

In the second modification, a plurality of clock signals CK6-0 to CK6-m taken out from the sixth clock signal generator 27 are inputted to the variable delay circuit for output DW0c, unlike the variable delay circuit for output DW0 according to the above-mentioned second embodiment. These plural clock signals CK6-0 to CK6-m correspond to the plural timing signals TS0 to TSm in the first embodiment described hereinbefore.

Like the plural clock signals CK1-0 to CK1-m in the above-mentioned second embodiment, these plural clock signals CK6-0 to CK6-m are taken out from predetermined positions in the sixth clock signal generator 27 so that the clock signals CK6-0 to CK60m ranging from the 0-th clock signals CK6-0 to the m-th clock signal CK6-m are delayed at intervals of 90 degrees in phase, and successively inputted to the variable delay circuit for output DW0c.

Other parts of the variable delay circuit for output DW0c have functions and configurations similar to those of the variable delay circuit for output DW0 according to the above-mentioned second embodiment, detailed descriptions of which are thus omitted here.

Like the variable delay circuit for output DW1 according to the above-mentioned second embodiment, the variable delay circuit for output DW1c is formed of the variable delay circuit 100 according to the first embodiment. The variable delay circuit for output DW1c delays a first input data signal I_DQe or a second data signal I_DQo inputted from the flip-flop FF1 by an output delay amount Dt1 set by the output delay amount setting section 23 on the basis of an output control signal d1 from the output delay amount setting section 23, and outputs the data signal to the flip-flop FF2.

The variable delay circuit for output DW1c is configured similarly to the above-described variable delay circuit for output DW0c, detailed description of which is thus omitted here.

Like the variable delay circuit for input DR1 according to the above-mentioned second embodiment, the variable delay circuit for input DR1c is formed of the variable delay circuit 100 according to the first embodiment.

In the second modification, the plural clock signals CK7-0 to CK7-m taken out from the seventh clock signal generator 28 are inputted to the variable delay circuit for input DR1c, unlike the variable delay circuit for input DR1 according to the above-mentioned second embodiment. These plural clock signals CK7-0 to CK7-m correspond to the plural timing signals TS0 to TSm in the first embodiment described above.

Like the plural timing signals CK3-0 to CK3-m in the above-mentioned second embodiment, these plural clock signals CK7-0 to CK7-m are taken out from predetermined positions in the seventh clock signal generator 28 so that the clock signals CK7-0 to CK7-m ranging from the 0-th clock signals CK7-0 to the m-th clock signal CK7-m are delayed at intervals of 90 degrees in phase, and successively inputted to the variable delay circuit for input DR1c.

Other parts of the variable delay circuit for input DR1c have similar functions and configurations to those of the variable delay circuit for input DR1 according to the above-mentioned second embodiment, detailed descriptions of which are thus omitted here.

Like the variable delay circuit for input DR2 according to the above-mentioned second embodiment, the variable delay circuit for input DR2c is formed of the variable delay circuit 100 according to the first embodiment. The variable delay circuit for input DR2c delays a fourth data signal O_DQo inputted from the flip-flop FF7 by an input delay amount Dt2 set by the input delay amount setting section 24 on the basis of an input control signal d2 from the input delay amount setting section 24, and inputs the data signal to the flip-flop FF8.

The variable delay circuit for input DR2c is configured similarly to the variable delay circuit for input DR1c, detailed description of which is thus omitted here.

As stated above, the information processing apparatus 10c according to the second modification of the second embodiment can provide the working effects similar to those provided by the above-mentioned first modification of the second embodiment.

[5] Others

The present invention is not limited to the above examples, but may be modified in various ways without departing from the spirit and scope of the invention.

In the above embodiments, the first delay circuit 101 is provided behind the second delay circuit 102. However, this invention is not limited to this example. For example, the first delay circuit 101 may be provided in front of the second delay circuit 102, and signals outputted from the first delay circuit 101 may be inputted to the second delay circuit 102 and the selector 103.

In the above embodiments, plural kinds of the timing signals TS0 to TSm are delayed at intervals of 90 degrees in phase ($\alpha=90$), and successively inputted to the selector 104. However, this invention is not limited to this example. It is required only that one or more timing signals delayed by $\alpha$ in phase from the data input signal IN (refer to FIG. 1) are inputted to the selector 104. In the case of $\alpha=180$ degrees, m+1=360/180 by referring to the equation in the above-mentioned first embodiment, hence m=1. Accordingly, it will do so long as one timing signal delayed by 180 degrees from the data signal IN is inputted to the selector 104.

In the above embodiments, the second delay circuit 102 has the D flip-flop 105. However, this invention is not limited to this example. For example, the second delay circuit 102 may have a D latch, instead of the D flip-flop.

Figure 13:
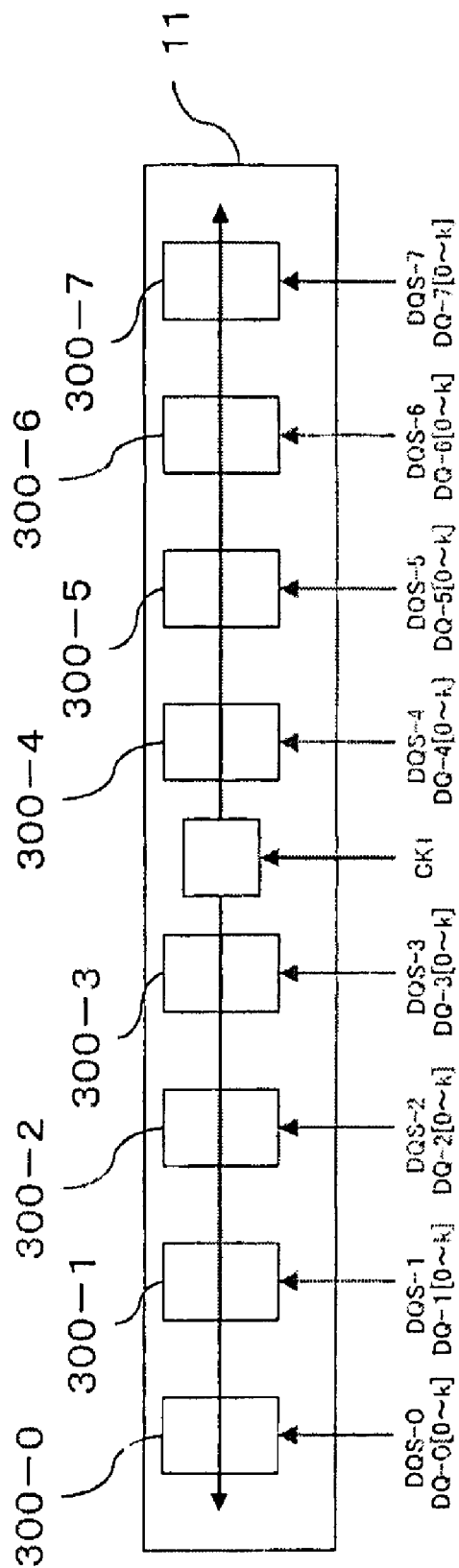
FIG. 13 is a diagram schematically showing another example of the configuration of the information processing apparatus according to the second embodiment of this invention.
Figure 14:
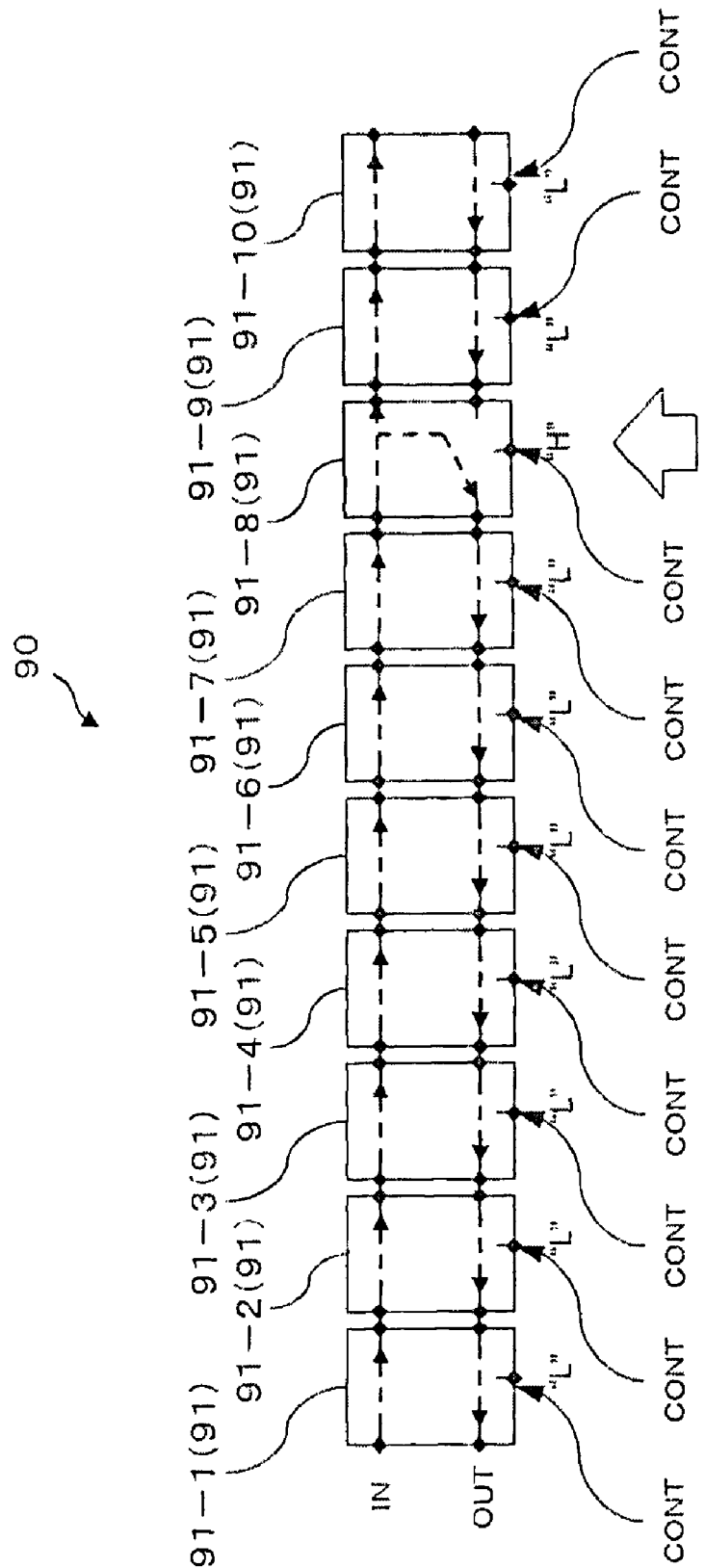
FIG. 14 is a diagram schematically showing one example of the configuration of a known variable delay circuit.

FIG. 13 is a diagram schematically showing another example of the configuration of the information processing apparatus according to the second embodiment of this invention.

In the above-mentioned second embodiment of this invention, the SDRAMs 300-0 to 300-n are wired in a daisy chain. However, this invention is not limited to this example. The clock signal line may be branched into two directions inside the DIMM 11. In the example (Registered DIMM) shown in FIG. 13, wiring is done in such a way that a clock signal CK1 is inputted to both the SDRAM 300-3 and the SDRAM 300-4, then successively propagated from the SDRAM 300-3 to the SDRAM 300-0, while successively propagated from the SDRAM 300-4 to the SDRAM 300-7. In this case, the output delay amounts Dt1-0 to Dt1-7 are successively set in the order of the output delay amount Dt1-3 to the output delay amount Dt1-0 while set in the order of the output delay amount Dt1-4 to the output delay amount Dt1-7.

In the case of a DIMM on which the SDRAMs 300 are double-sided mounted although not shown, that is, when pairs of the SDRAM 300-0 and the SDRAM 300-1, the SDRAM 300-2 and the SDRAM 300-3, the SDRAM 300-4 and the SDRAM 300-5, and the SDRAM 300-6 and the SDRAM 300-7 are each double-sided mounted, the output delay amounts Dt1-0 to Dt1-7 are successively set in the order of the output delay mount Dt1-2 and the output delay amount Dt1-0, the output delay amount Dt1-3 and the output delay amount Dt1-1, the output delay mount Dt1-4 and the output delay amount Dt1-6, and the output delay amount Dt1-5 and the output delay amount Dt1-7.

In the above-mentioned second embodiment, the processor 13 executes a delay time control program (delay amount setting program) thereby to function as the output delay amount setting section 23 and the input delay amount setting section 24.

The program (delay time control program) for realizing functions as the output delay amount setting section 23 and the input delay amount setting section 24 is provided in a form recorded in a computer-readable recording medium such as a flexible disc, CD (CD-ROM, CD-R, CD-RW, etc.), a DVD (DVD-ROM, DVD-RAM, DVD-R, DVD+R, DVD-RW, DVD+RW, HD-DVD, etc.), a blu-ray disc, a magnetic disk, an optical disk, an opto-magnetic disc or the like. A computer reads the program from the recording medium, transfers it to an internal storage device or an external storage device, and stores it for use. Further, the program may be recorded in a storage device (a recording medium) such as a magnetic disc, an optical disk, an opto-magnetic disc or the like and provided to a computer from the storage device via a communication line.

When the functions of the output delay amount setting section 23 and the input delay amount setting section 24 are realized, the program stored in the internal storage device is executed by a microprocessor of the computer. On this occasion, the computer may read the program recorded in a recording medium to execute it.

In the second embodiment of this invention, a computer is a concept including hardware and an operating system, and stands for hardware that operates under the control of the operating system. Further, when hardware is operated with an application program alone without an operating system, the hardware itself corresponds to a computer. Hardware is provided with at least a microprocessor such as CPU or the like, and a means to read a computer program recorded in a recording medium. In the second embodiment of this invention, the information processing apparatuses 10a, 10b and 10c have a function as a computer.

Furthermore, as the recording medium in the second embodiment of this invention, in addition to the flexible disc, CD, DVD, blu-ray disc, magnetic disc, optical disc or opto-magnetic disc, a variety of computer-readable media such as IC card, ROM cartridge, magnetic disc, punch card, internal storage device (memory such as RAM, ROM, etc.) of a computer, external storage device and printing on which code such as bar code is printed may be used.

What is claimed is:

1. A memory control circuit having a write leveling function and controlling a plurality of memory elements, comprising:
    variable delay circuits provided for the memory elements, respectively, to delay a data strobe output signal to be outputted to said memory elements by an output delay amount set using the write leveling function; said variable delay circuits respectively comprising:
        a first output delay section to delay the data strobe output signal by a first output delay amount;
        a second output delay section to delay the data strobe output signal by a second output delay amount greater than the first output delay amount; and
        an output delay amount selector to select a signal route where the output delay amount is a sum of the first output delay amount and the second output delay amount when the output delay amount exceeds a maximum output delay amount delayable by said first output delay section.

2. The memory control circuit according to claim 1, wherein a clock signal line is wired to said plurality of memory elements in a daisy chain.

3. The memory control circuit according to claim 1, wherein each of said second output delay sections comprises:
    a selecting circuit for output to select any one of plural kinds of timing signals on the basis of the output delay amount; and
    a sequential circuit for output to delay the data strobe output signal by the second output delay amount according to the timing signal selected by said selecting circuit for output.

4. The memory control circuit according to claim 3, wherein the timing signal is a clock signal used when a control of a read/write operation is performed on the corresponding memory element.

5. A memory control circuit having a write leveling function and controlling a plurality of memory elements, comprising:
    variable delay circuits provided for the memory elements, respectively, to delay a data input signal inputted from said respective memory elements by an input delay amount set according to an output delay amount of a data strobe output signal outputted to said memory elements set using the write leveling function; said variable delay circuits for input respectively comprising:
        a first input delay section to delay the data input signal by a first input delay amount;
        a second input delay section to delay the data input signal by a second input delay amount greater than the first input delay amount; and
        an input delay amount selector to select a signal route where the input delay amount is a sum of the first input delay amount and the second delay amount when the input delay amount exceeds a maximum input delay amount delayable by said first input delay section.

6. The memory control circuit according to claim 5, wherein a clock signal line is wired to said plurality of memory elements in a daisy chain.

7. The memory control circuit according to claim 5, wherein each of said second input delay sections comprises:
    a selecting circuit for input to select any one of plural kinds of timing signals on the basis of the input delay amount; and
    a sequential circuit for input to select the data input signal by the second input delay amount according to the timing signal selected by said selecting circuit for input.

8. The memory control circuit according to claim 7, wherein the timing signal is a signal used when a control of a read/write operation is performed on the corresponding memory element.

9. A delay amount setting apparatus for setting the output delay amount of said memory control circuit in claim 1 for each of said plurality of memory elements, comprising:
    an output delay amount setting section to set an output delay amount to be set for one memory element on the basis of an output delay amount having been already set for another memory element.

10. The delay amount setting apparatus according to claim 9, wherein said output delay amount setting section successively sets the output delay amounts for the plurality of memory elements in order along a wiring route of a clock signal line.

11. The delay amount setting apparatus according to claim 10, wherein said output delay amount setting section employs an output delay amount having been already set for the another memory element neighboring the one memory element as a start delay amount, and changes step-wisely the start delay amount to set the output delay amounts to be set.

12. A delay amount setting method for setting the output delay amounts of said memory control circuit in claim 1 for the plurality of memory elements, comprising:
    setting an output delay amount to be set for one memory element on the basis of an output delay amount having been already set for another memory element.

13. The delay amount setting method according to claim 12, wherein, said setting an output delay amount comprises successively setting the output delay amounts for the plurality of memory elements in order along a wiring route of a clock signal line.

14. The delay amount setting method according to claim 13, wherein, said setting an output delay amount comprises employing an output delay amount having been already set for the another memory element neighboring the one memory element as a start delay amount, and changing step-wisely the start delay amount to set output delay amounts to be set.

15. A computer readable recording medium recording a delay amount setting program for causing a computer to execute a delay amount setting function of setting the output delay amounts of said memory control circuit in claim 1 for said plurality of memory elements, said delay amount setting program causing said computer to function as:

an output delay amount setting section to set an output delay amount to be set for one memory element on the basis of an output delay amount having been already set for another memory element.

* * * * *